(12) United States Patent
Maxim et al.

(10) Patent No.: US 7,599,673 B2
(45) Date of Patent: *Oct. 6, 2009

(54) RECEIVER ARCHITECTURES UTILIZING COARSE ANALOG TUNING AND ASSOCIATED METHODS

(75) Inventors: Adrian Maxim, Austin, TX (US); Ramin Khoini-Poorfard, Austin, TX (US); James Kao, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 530 days.

This patent is subject to a terminal disclaimer.

(21) Appl. No.: 11/240,814

(22) Filed: Sep. 30, 2005

(65) Prior Publication Data

US 2006/0089114 A1  Apr. 27, 2006

Related U.S. Application Data

(63) Continuation-in-part of application No. 10/412,963, filed on Apr. 14, 2003, now Pat. No. 7,340,230.

(51) Int. Cl.
*H04B 1/18* (2006.01)
(52) U.S. Cl. .................................. 455/179.1; 455/260
(58) Field of Classification Search ........................ None
See application file for complete search history.

(56) References Cited

U.S. PATENT DOCUMENTS 6,308,055 B1 * 10/2001 Welland et al. ............. 455/260

| | | | |
|---|---|---|---|
| 6,591,091 B1 * | 7/2003 | Vorenkamp et al. | 455/179.1 |
| 7,167,694 B2 * | 1/2007 | Khoini-Poorfard et al. | 455/132 |
| 7,340,230 B2 * | 3/2008 | Khoini-Poorfard et al. | 455/132 |

FOREIGN PATENT DOCUMENTS

| EP | 1 056 207 | 11/2000 |
|---|---|---|
| WO | WO 2004/093327 | 10/2004 |

* cited by examiner

*Primary Examiner*—Thanh C Le
(74) *Attorney, Agent, or Firm*—Trop, Pruner & Hu, P.C.

(57) ABSTRACT

A technique includes receiving a signal spectrum that includes a plurality of channels within a first frequency range. The technique includes receiving a selection signal that identifies at least one desired channel to be tuned. The technique includes providing an oscillator that has a second frequency range that is substantially the same as the first frequency range and controlling the oscillators to generate one of a plurality of coarse-tune analog mixing signals. The signals substantially span across the second frequency range and each depends upon the location of the desired channel within the signal spectrum. The technique includes mixing the signal spectrum with the selected coarse-tune analog mixing signal to generate a coarsely tuned signal spectrum. The technique includes digitally processing the coarsely-tuned signal spectrum to fine tune the desired channel and to produce digital baseband signals for the desired channel.

25 Claims, 26 Drawing Sheets

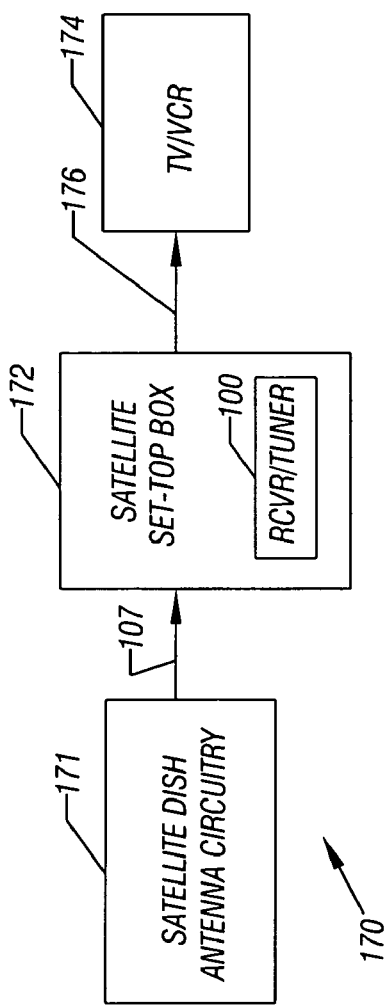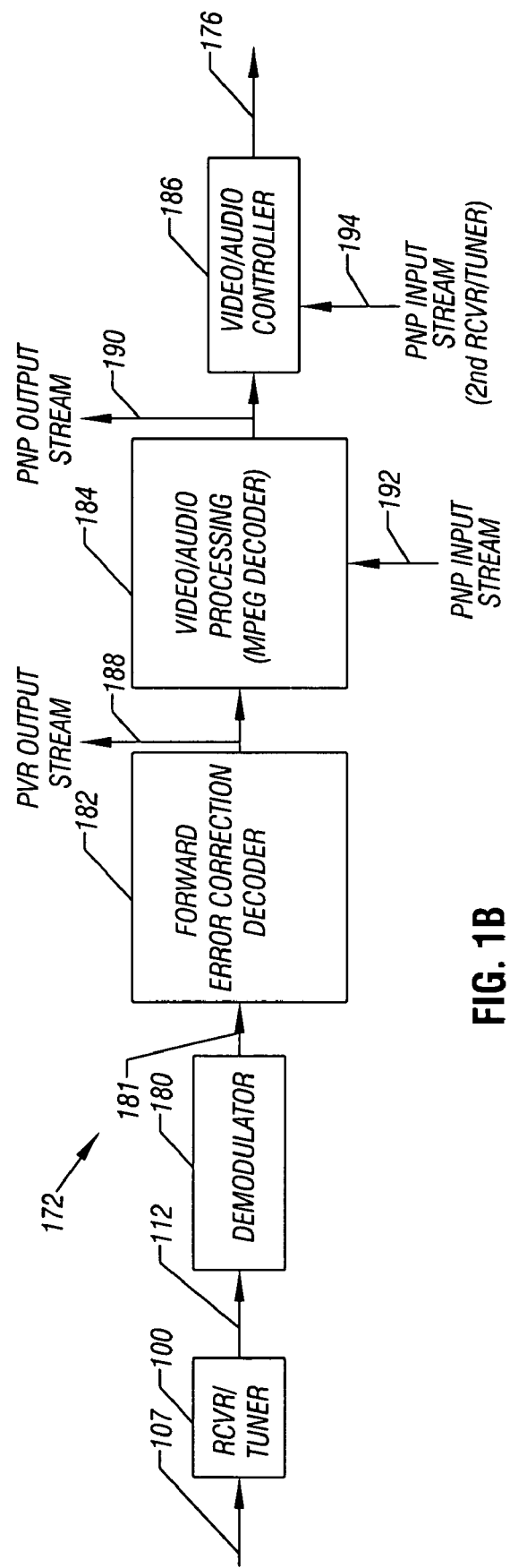

RECEIVER ARCHITECTURES UTILIZING COARSE ANALOG TUNING AND ASSOCIATED METHODS

This application is a continuation-in-part of U.S. Patent Application Ser. No. 10/412,963 now U.S. Pat. No. 7,340,230, entitled, "RECEIVER ARCHITECTURE UTILIZING COARSE ANALOG TUNING AND ASSOCIATED METHODS," filed on Apr. 14, 2003.

BACKGROUND

The application is generally related to receiver architectures utilizing coarse analog tuning and associated methods.

In general, the most ideal receiver architecture for an integrated circuit from a bill-of-material point of view is usually a direct down conversion (DDC) architecture. However, in practice, there are several issues that often prohibit the practical design of integrated circuit implementations that use DDC architectures. These issues typically include noise from the DC offset voltage and 1/f noise from baseband circuitry located on the integrated circuit. In mobile applications, such as with cellular phones, the DC offset voltage is a time varying entity which makes its cancellation a very difficult task. In other applications where mobility is not a concern, such as with satellite receivers, the DC offset voltage can be stored and cancelled, such as through the use of external storage capacitors. However, 1/f noise is still an issue and often degrades CMOS satellite tuners that use a DDC architecture.

Conventional home satellite television systems utilize a fixed dish antenna to receive satellite communications. After receiving the satellite signal, the dish antenna circuitry sends a satellite spectrum signal to a satellite receiver or set-top box that is often located near a television through which the viewer desires to watch the satellite programming. This satellite receiver uses receive path circuitry to tune the program channel that was selected by the user. Throughout the world, the satellite channel spectrum sent to the set-top box is often structured to include 32 transponder channels between 950 MHz and 2150 MHz with each transponder channel carrying a number of different program channels. Each transponder will typically transmit multiple program channels that are time-multiplexed on one carrier signal. Alternatively, the multiple program channels may be frequency multiplexed within the output of each transponder. The total number of received program channels considering all the transponders together is typically well over 300 program channels.

Conventional architectures for set-top box satellite receivers include low intermediate-frequency (IF) architectures and DDC architectures. Low-IF architectures utilize two mixing frequencies. The first mixing frequency is designed to be a variable frequency that is used to mix the selected satellite transponder channel to a pre-selected IF frequency that is close to DC. And the second mixing frequency is designed to be the low-IF frequency that is used to mix the satellite spectrum to DC. Direct down conversion (DDC) architectures utilize a single mixing frequency. This mixing frequency is designed to be a variable frequency that is used to mix the selected satellite transponder channel directly to DC.

As indicated above, DDC architectures are desirable due to the efficiencies they provide. DDC architectures, however, suffer from disadvantages such as susceptibility to DC noise, 1/f noise and I/Q path imbalances. DDC architectures also often require narrow-band PLLs to provide mixing frequencies, and implementations of such narrow-band PLLs typically utilize LC-based voltage controlled oscillators (VCOs). Low-IF architectures, like DDC architectures, also typically require the use of such narrow-band PLLs with LC-based VCOs. Such LC-based VCOs are often difficult to tune over wide frequency ranges and often are prone to magnetically pick up any magnetically radiated noise. In addition, interference problems arise because the center frequency for the selected transponder channel and the DDC mixing signal are typically at the same frequency or are very close in frequency. To solve this interference problem, some systems have implemented receivers where the DDC mixing frequency is double (or half) of what the required frequency is, and at the mixer input, a divider (or doubler) translates the DDC mixing signal into the wanted frequency. Furthermore, where two tuners are desired on the same integrated circuit, two DDC receivers, as well as two low-IF receivers, will have a tendency to interfere with each other, and their VCOs also have a tendency to inter-lock into one another, particularly where the selected transponder channels for each tuner are close together. The invention generally relates to controlling a voltage regulator.

SUMMARY

In an embodiment of the invention, a technique includes receiving a signal spectrum that includes a plurality of channels within a first frequency range. The technique includes receiving a selection signal that identifies at least one desired channel to be tuned. The technique includes providing an oscillator that has a second frequency range that is substantially the same as the first frequency range and controlling the oscillators to generate one of a plurality of coarse-tune analog mixing signals. The frequencies of the coarse-tune analog mixing signals substantially span across the second frequency range and each depends upon the location of the desired channel within the signal spectrum. The technique includes mixing the signal spectrum with the selected coarse-tune analog mixing signal to generate a coarsely tuned signal spectrum. The technique includes digitally processing the coarsely-tuned signal spectrum to fine tune the desired channel and to produce digital baseband signals for the desired channel.

In another embodiment of the invention, a semiconductor package includes a monolithic semiconductor die, a first tuner and a second tuner. The first and second tuners are fabricated in the die. The first tuner receives an input signal that has a signal spectrum. The first tuner includes a ring oscillator, first analog coarse-tune circuitry and digital fine tune circuitry. The ring oscillator provides a first coarse-tune analog mixing signal in response to a channel selection signal that indicates a desired channel to be tuned from the signal spectrum. The first analog coarse-tune circuitry generates a first coarsely-tuned signal spectrum in response to the second coarse-tune analog mixing signal. The digital fine tune circuitry provides at least one digital baseband signal in response to the first coarsely-tuned signal spectrum. The second tuner receives the input signal and includes a ring oscillator to provide a mixing signal for the second tuner.

Advantages and other features of the invention will become apparent from the following drawing, description and claims.

BRIEF DESCRIPTION OF THE DRAWING

FIG. 1A is a block diagram for an example satellite set-top box environment within which the receiver architecture of the present invention could be utilized.

FIG. 1B is a block diagram for example satellite set-top box circuitry that could include the receiver architecture of the present invention.

DETAILED DESCRIPTION

Figure 1C:
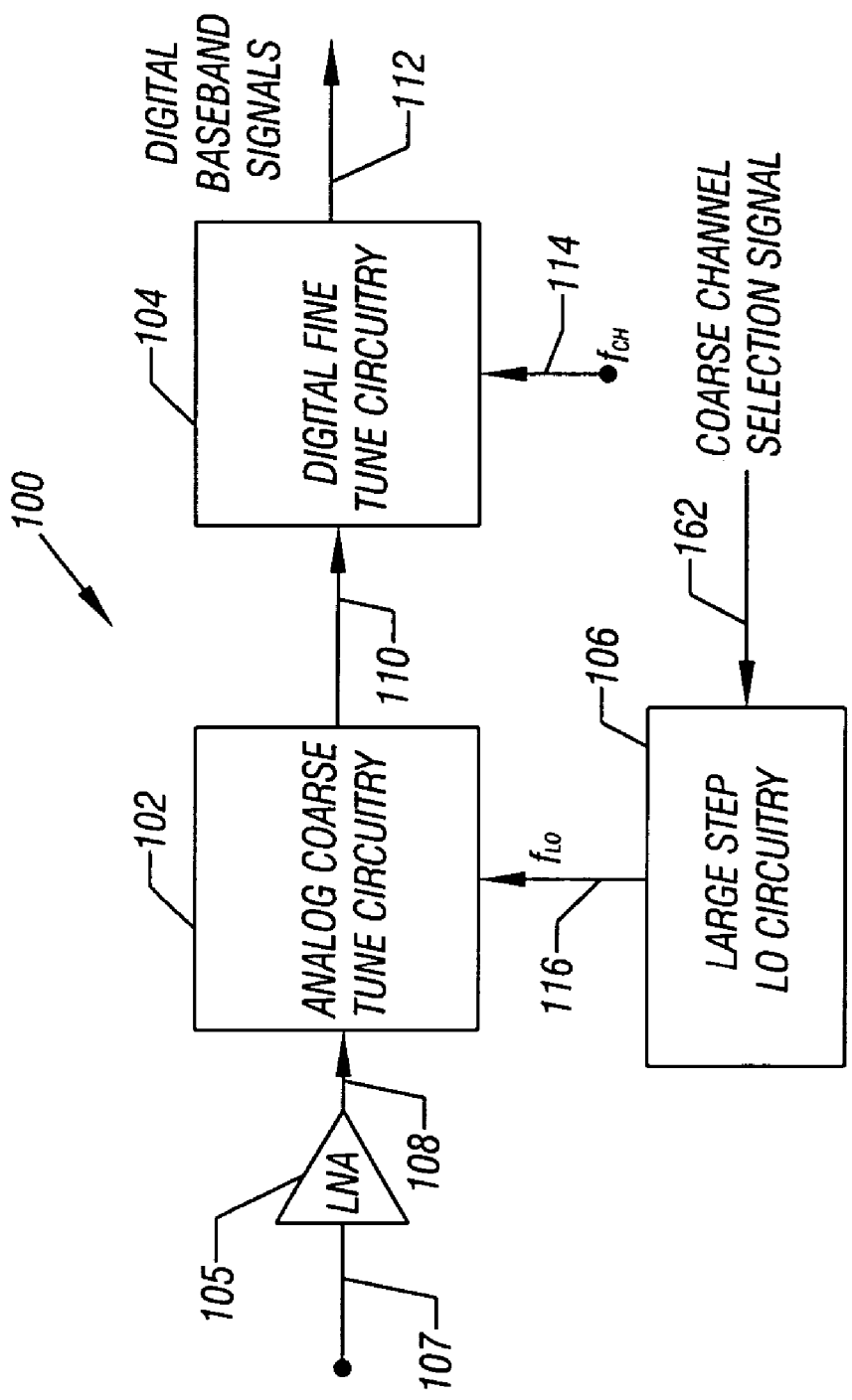
FIG. 1C is a block diagram of basic receiver architecture according to the present invention utilizing a large-step local oscillator.

The present invention provides receiver architectures and associated methods that coarse analog tune circuitry to provide initial analog coarse tuning of desired channels within a received signal spectrum. In the description of the present invention below, the signal spectrum is primarily described with respect to a satellite transponder channel spectrum; however, it is noted that the receiver architecture and methods of the present invention could be used with other channel signal spectrums utilized by other systems, if desired.

FIG. 1A is a block diagram for an example satellite set-top box environment 170 within which the receiver or tuner architecture 100 of the present invention could be utilized. In the embodiment depicted, a satellite set-top box 172 receives an input signal spectrum from satellite dish antenna circuitry 171. The satellite set-top box 172 processes this signal spectrum in part utilizing the receiver/tuner circuitry 100. The output from the satellite set-top box 172 is then provided to a television, a videocassette recorder (VCR) or other device as represented by the TV/VCR block 174.

FIG. 1B is a block diagram for example circuitry for a satellite set-top box 172 that could include the receiver architecture 100 of the present invention. The input signal spectrum 107 can be, for example, 32 transponder channels between 950 MHz and 2150 MHz with each transponder channel carrying a number of different program channels. This signal spectrum 107 can be processed by the receiver/tuner 100 to provide digital baseband output signals 112 that represent a tuned transponder channel. These output signals 112 can then be processed by a demodulator 180 that can tune one of the program channels within the tuned transponder channel. The output signal 181 from the demodulator, which represents a tuned program channel within the transponder channel that was tuned by the receiver/tuner 100, can then be processed with a forward error correction decoder 182 to produce a digital output stream. This digital output stream is typically the data stream that stored by personal video recorders (PVRs) for later use and viewing by a user as represented by the PVR output stream 188. The output of the decoder 182, or the stored PVR data as represented by PVR input stream 192, can then be processed by video/audio processing circuitry 184 that can include processing circuitry such as an MPEG decoder. The output of the processing circuitry 184 is typically the digital video data stream that represents the program channel and is used for picture-in-picture (PnP) operations, for example, where the set-top box circuitry 172 includes two tuners with one tuner providing the primary viewing feed and a second tuner providing the PnP viewing feed. The output of the processing circuitry 184, as well as a PnP input stream 194 from a second tuner if a second tuner is being utilized for PnP operations, can be processed by a video/audio controller 186 to generate a video output signal 176 that can subsequently be utilized, for example, with a TV or VCR. Additional tuners could also be used, if desired.

FIG. 1C is a block diagram of basic receiver architecture 100 according to the present invention utilizing a large-step local oscillator 106. Input signal 107, for example from a satellite dish antenna or other source, is received and passed through a low noise automatic-gain amplifier (LNA) 105. In the embodiments described herein, it is assumed that the input signal 107 is a signal spectrum that includes multiple channels, such as a satellite television signals that includes 32 transponder channels between the frequencies of 950 MHz and 2150 MHz. The output signal 108 from LNA 105 is initially tuned with analog coarse tune circuitry 102 utilizing a local oscillator mixing frequency ($f_{LO}$) provided by large-step local oscillator (LO) circuitry 106. The large-step LO circuitry 106 also receives a coarse channel selection signal 162. The resulting coarsely tuned signal 110 is then subjected to digital fine tune circuitry 104 utilizing the center frequency ($f_{CH}$) 114 for the desired channel to produce digital baseband signals 112.

Figure 1D:
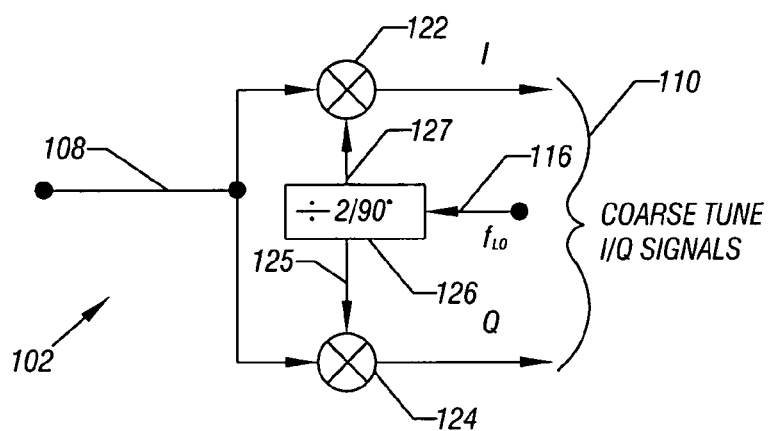
FIG. 1D is a block diagram of an embodiment for coarse tune circuitry.

FIG. 1D is a block diagram of an embodiment for coarse tune circuitry 102. The channel spectrum signal 108 is sent to mixers 122 and 124. The output Q signal from mixer 124 is desired to be offset by a phase shift of 90 degrees from the output I signal from mixer 122. To provide these two signals, a local oscillator mixing frequency ($f_{LO}$) 116 and a dual divide-by-two and quadrature shift block (÷2/90°) 126 may be utilized. The local oscillator mixing frequency ($f_{LO}$) 116 is divided by two in block 126 to provide mixing signals 125 and 127. Block 126 also delays the signal 125 to mixer 124 by 90 degrees with respect to the signal 127 to mixer 122. Mixer 122 mixes the channel spectrum signal 108 with the signal 1277 to provide an in-phase signal (I) for the coarse tune I/Q signals 110. And mixer 124 mixes the channel spectrum signal 108 with the signal 125 to provide the quadrature signal (Q) for the coarse tuned I/Q signals 110. Because the dual divide-by-two and quadrature shift block (÷2/90°) 126 will divide the local oscillator mixing frequency ($f_{LO}$) 116 by two, the local oscillator mixing freq frequency ($f_{LO}$) 116 will be two-times the desired mixing frequency for the mixers 122 and 124. It is also noted that the block 126 could be modified, if desired, to provide any desired frequency division, such as a divide-by-four operation, assuming that a corresponding change were made to the local oscillator mixing frequency ($f_{LO}$) 116 so that the desired mixing frequency was still received by the mixers 122 and 124. It is further noted that block 126 could simply provide a quadrature phase shift and provide no frequency division, such that the local oscillator mixing frequency ($f_{LO}$) 116 is directly used by the mixers 122 and 124 except for the 90 degrees phase shift between the two signal 125 and 127.

Figure 1E:
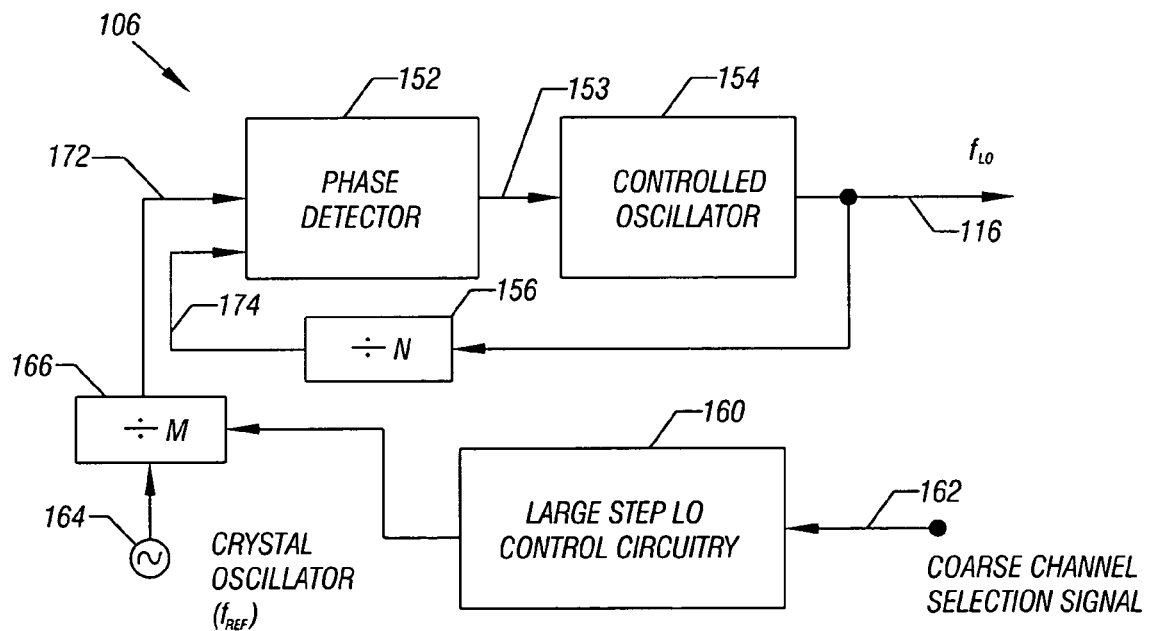
FIG. 1E is a block diagram of an embodiment for a large-step local oscillator.

FIG. 1E is a block diagram of an embodiment for a large-step local oscillator 106. The large-step local oscillator 106, according to the present invention, is designed to generate a mixing signal at one of a plurality of predetermined frequencies. The output LO frequency is selected based upon the channel within the spectrum that is desired to be tuned. The output LO frequencies can be organized and uniformly or non-uniformly spaced as desired. As one example, the output LO frequencies can be a fixed bandwidth apart from each other and can span the entire input channel spectrum signal 108. In the embodiment depicted, the local oscillator mixing frequency ($f_{LO}$) 116 is generated using phase-lock-loop (PLL) circuitry. The phase detector 152 receives a signal 172 that represents a divided version of a reference frequency ($f_{REF}$) and signal 174 that represents a divided version of the output frequency ($f_{LO}$) 116. A reference frequency ($f_{REF}$) can be generated, for example, using crystal oscillator 164. The output of the crystal oscillator 164 is provided to divide-by-M block 166 to produce the signal 172. The output frequency ($f_{LO}$) 116 is provided to divide-by-N block 156 to produce the signal 174. The dividers 156 and 166 are controlled by large-step LO control circuitry 160. Based upon a coarse channel selection signal 162, which represents information identifying the channel that is desired to be tuned, the control circuitry 160 sets the dividers 156 and 166 to generate a desired output frequency ($f_{LO}$) 116. Depending upon these settings for the dividers 156 and 166, the phase detector 152 and controlled oscillator 154 act together to provide phase-lock-loop (PLL) circuitry that attempts to lock the output frequency ($f_{LO}$) 116 to a selected LO mixing frequency, as described in more detail below.

In operation, the phase detector 152 provides a control input 153 to the controlled oscillator 154 in order to control the output frequency of the controlled oscillator 154. The nature of this control input 153 will depend upon the circuitry used to implement the controlled oscillator 154. For example, if a voltage controlled oscillator (VCO) is used, the control input 153 can include one or more voltage control signals. If LC-tank oscillator architecture is utilized for the VCO, one or more voltage control signals could be used to control one or more variable capacitances within the VCO circuitry. Advantageously, the large-step LO receiver architecture of the present invention allows for the use of less precise oscillator architectures, such as RC-based oscillator architectures. One RC-based oscillator architecture that could be used is a inverter-based ring oscillator where the delay of each inverter stage can be adjusting using one or more control signals as the control input 153. It is noted, therefore, that a wide variety of oscillator architectures and associated control signals could be used for the controlled oscillator 154 and the control input 153. This wide variety of applicable architectures is in part due to the wide-band nature of the PLL that can be utilized with the architecture of the present invention, which in turn causes the output phase noise to track the phase noise of the reference oscillator over a wider spectrum range thereby relaxing the required VCO phase noise specifications.

Figure 2A:
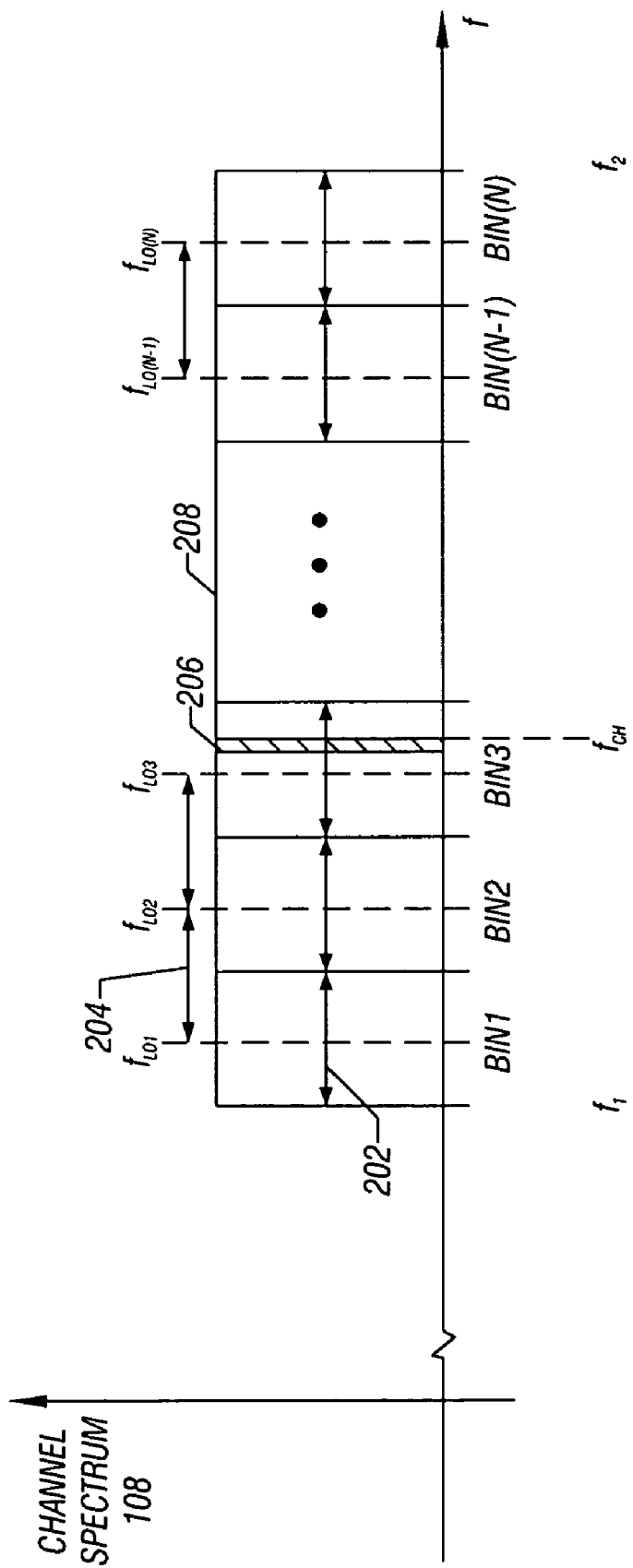
FIG. 2A is a diagram for an example channel spectrum signal with predetermined frequency bins spanning the channel spectrum.

FIG. 2A is a diagram for an example channel spectrum signal 108 with predetermined frequency bins spanning the channel spectrum 208. The channel spectrum can include any number of different channels, such as channel 206 with a center frequency at $f_{CH}$, and the channel spectrum can span any desired frequency range. With respect to satellite set-top box receivers, for example, the channel spectrum includes 32 transponder channels between 950 MHz and 2150 MHz. In the embodiment depicted, the spectrum 208 between frequencies $f_1$ and $f_2$ has been partitioned into N different bins, which are designated BIN1, BIN2, BIN3 . . . BIN(N-1), BIN(N). Each bin has a single pre-selected LO frequency, which are designated $f_{LO1}$, $f_{LO2}$, $f_{LO3}$ . . . $f_{LO(N-1)}$, $f_{LO1(N)}$. If the desired channel 206 falls within the bin, the bin LO frequency can be used as the mixing signal to provide the down conversion of the desired channel to a frequency range around DC. In the embodiment depicted, channel 206 falls within BIN3, and LO frequency $f_{LO3}$ can be used as the mixing signal. In addition, in the embodiment depicted, the width 202 of each bin has been selected to be the same, and the width 204 between each LO frequency has been selected to be the same. It is noted, however, that frequency bin sizes and LO frequencies can be non-uniformly distributed and can be varied or modified depending upon the implementation desired. In addition, multiple LO frequencies per bin could be used and different numbers of LO frequencies could also be used depending upon the implementation desired.

Figure 2B:
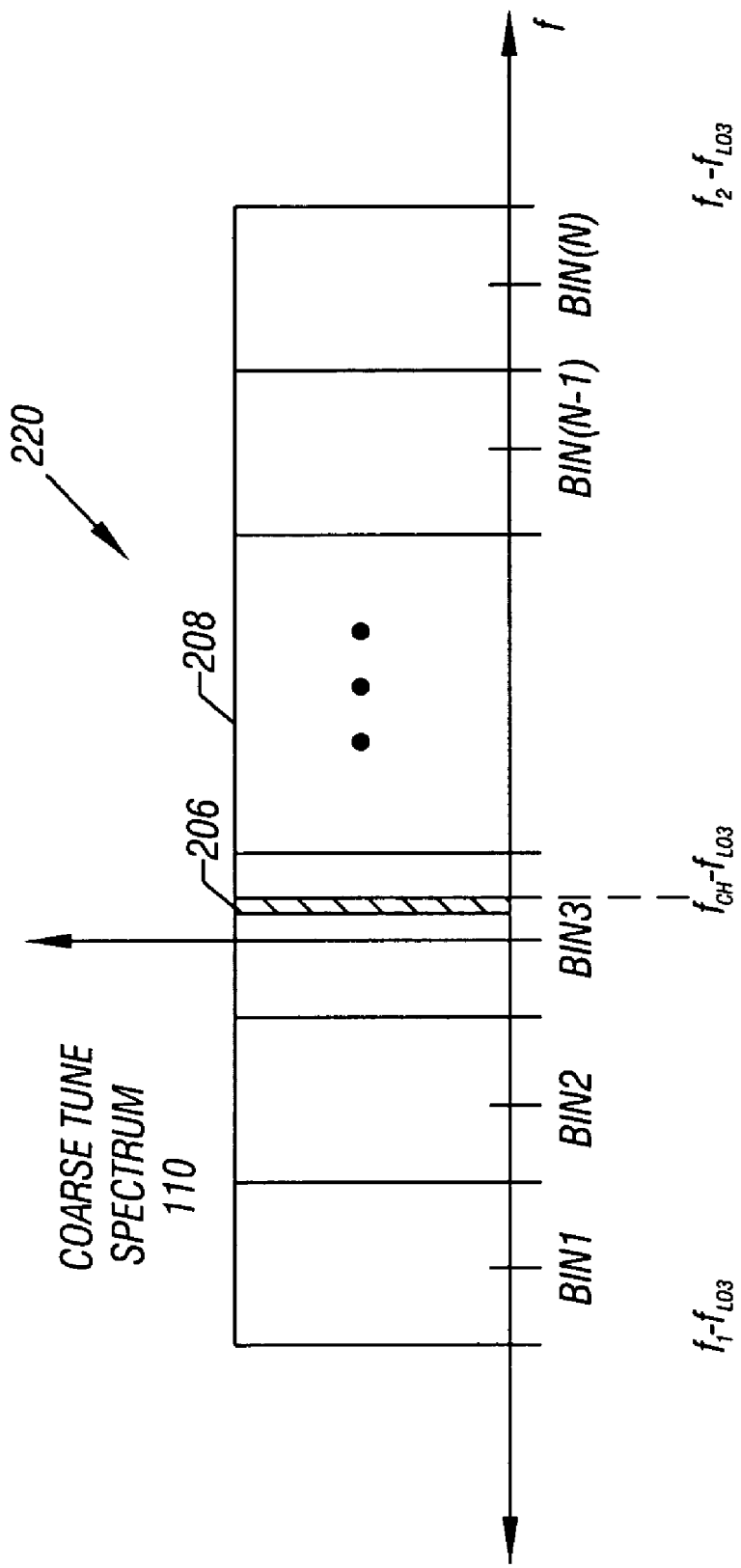
FIG. 2B is a diagram for an example coarse tune signal spectrum.

FIG. 2B is a diagram for an example coarse tune signal spectrum 110 after it has been mixed with LO frequency $f_{LO3}$. As depicted, the channel spectrum 208 has been moved so that channel 206 is now centered at a resulting frequency that is equal to the channel center frequency ($f_{CH}$) minus the LO mixing frequency ($f_{LO3}$). The spectrum 208 similarly has been mixed down so that the spectrum is now between the frequencies $f_1-f_{LO3}$ and $f_2-f_{LO3}$.

Figure 2C:
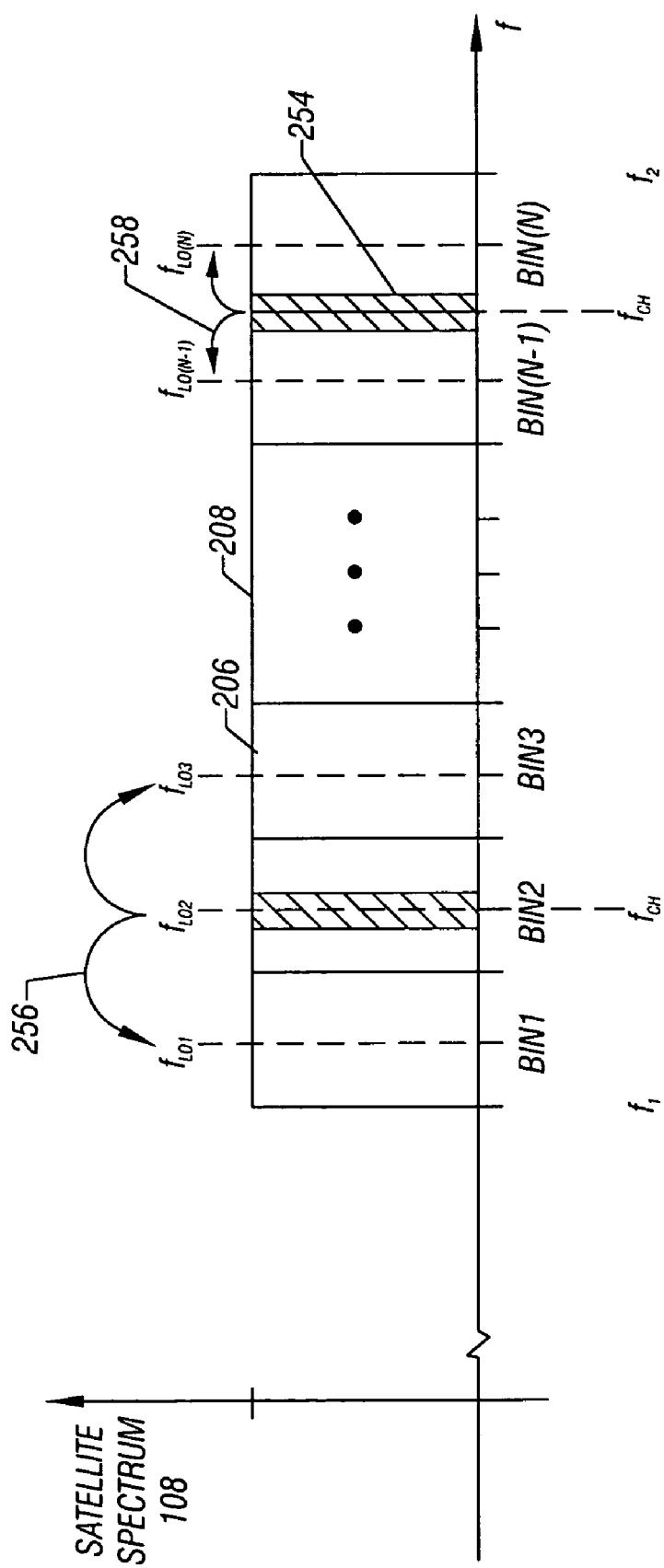
FIG. 2C is a diagram for an example satellite signal spectrum where desired channels overlap a bin local oscillator frequency or a bin-to-bin boundary.

FIG. 2C is a diagram for an example satellite signal spectrum 208 where a desired channel 252 overlaps a bin LO frequency and a desired channel 254 overlaps a bin-to-bin boundary. First, considering channel 254, its channel center frequency ($f_{CH}$) is shown as sitting on top of the boundary between BIN(N-1) and BIN(N). As such, the LO frequency $f_{LO(N-1)}$ for BIN(N-1) or the LO frequency $f_{LO(N)}$ for BIN(N) can be used as represented by the arrows identified by element number 258. Now, considering channel 252, its channel center frequency ($f_{CH}$) is shown as sitting on top of the LO frequency $f_{LO2}$ for BIN2 in which channel 252 falls. If LO frequency $f_{LO2}$ for BIN2 were used to mix down channel 252, the channel center frequency ($f_{CH}$) would land at DC thereby in effect causing a direct down conversion of channel 252. This is an undesirable result according to the architecture of the present invention. Thus, where the channel 252 overlaps the LO frequency for the bin in which it falls, the LO frequency for an adjacent bin can be used as the mixing LO frequency. As depicted, therefore, instead of using LO frequency $f_{LO2}$ for BIN2 to mix down channel 252, the LO frequency $f_{LO1}$ for BIN1 or the LO frequency $f_{LO3}$ for BIN3 can be used as represented by the arrows identified by element number 256, thereby avoiding direct down conversion to DC. It is noted that the decision of which bin LO frequency to use can be made utilizing any of a wide variety of considerations depending upon the particular application and design criterion involved.

Figure 3:
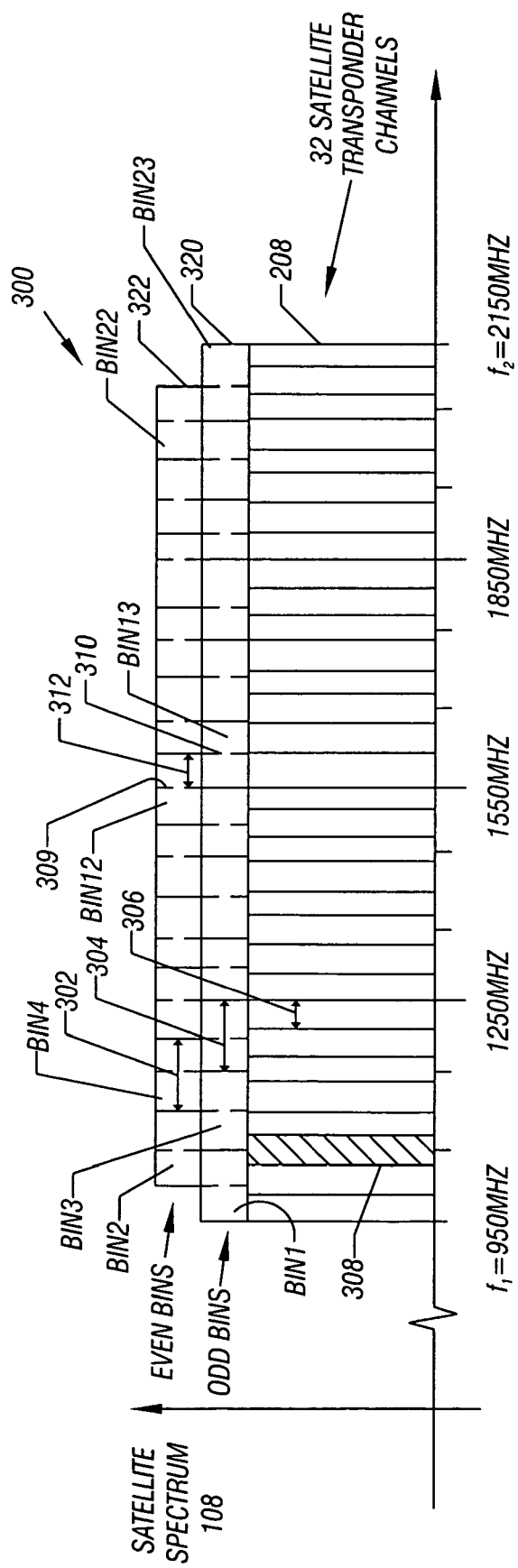
FIG. 3 is a diagram of an embodiment for a overlapping bin architecture for an example 32 channel satellite signal spectrum for a television set-top box.

FIG. 3 is a diagram of an embodiment 300 for an overlapping bin architecture for an example 32 transponder channel satellite signal spectrum for a television set-top box. In particular, the satellite transponder channel spectrum 208 includes 32 transponder channels between 950 MHz and 2150 MHz with each channel being about 37.5 MHz wide. As depicted, channel 308 represents the transponder channel desired to be tuned, and element 306 represents the width of channels. As configured in the embodiment 300, there are 23 overlapping bins configured as 12 odd numbered bins 320 (BIN1, BIN3 ... BIN23) and 11 even numbered bins 321 (BIN2, BIN4 ... BIN22). The width of each odd bin 320 as designated by element 304 can be selected to be the same. The width of each even bin 322 as designated by element 302 can be selected to be the same. And the widths 320 and 322 can be selected to be the same. As discussed above, each bin can be configured to have a LO frequency associated with it that is located at the center of the bin as represented by the dotted lines, such as dotted lines 308 and 310. The width between LO frequencies associated with each consecutive bin, such as between the LO frequencies for BIN12 and BIN13, can be the same as designated by element 312. As such, the width between LO frequencies of consecutively numbered bins is half the width of the bins. For example, if widths 302 and 304 of the odd and even bins are set to 100 MHz, the width or frequency step between LO frequencies for consecutively numbered bins becomes 50 MHz.

An overlapping bin architecture, such as embodiment 300, helps improve the performance and efficiency of the receiver architecture of the present invention by providing redundancy and helping to resolve channels whose center frequencies happen to be at the boundary between two bins. As will be discussed in more detail below, it is often desirable to include two or more receivers in a single integrated circuit and to reduce the frequency range within which the digital fine tune circuitry 104 must operate. In selecting the bin configuration for a channel spectrum, it is advantageous to increase the frequency step between LO frequencies so that adjacent LO frequencies from two or more separate receivers in an integrated multi-tuner satellite receiver are far enough apart to avoid interference with each other. However, it is also advantageous to reduce the frequency step between the LO frequencies to reduce the frequency range within which the digital fine tune circuitry 104 must operate and to relax the design specifications for the digital fine tune circuitry 104, such as, for example, low pass filter (LPF) circuitry and analog-to-digital conversion (ADC) circuitry. For the embodiment 300 of FIG. 3, a 50 MHz frequency step is one reasonable choice for the frequency step when considering the trade-off between minimizing the frequency step while still keeping adjacent LO frequencies separated to avoid interference. It is also noted that a 10 MHz frequency step may also be a desirable frequency step. And it is further noted that other frequency steps or configurations may be chosen depending upon the particular design requirements involved.

With respect to standard satellite tuners and a transponder channel signal spectrum between 950 MHz and 2150 MHz, the local oscillator mixing frequency resolutions are typically on the range of 100 KHz. Thus, where the frequency step is chosen to be 10-50 MHz or more, the coarse tuning provided by the large-step oscillator of the present invention can provide frequency steps that are 100-times or more larger than traditional resolutions. Because the bandwidth of PLLs that provide these local oscillator output signals have a bandwidths that are typically ⅒ of the frequency step, traditional PLLs would be expected to have bandwidths on the range of 10 KHz. In contrast, with the large-step local oscillator of the present invention, the bandwidth of the PLL would likely be more on the order of 1-5 MHz or higher, depending upon the resolution chosen for the coarse tune frequency steps. It is noted that these numbers are provided as examples and should not be considered as limiting the invention. The coarse analog tuning and fine digital tuning architecture discussed herein is applicable to a wide range of applications and not limited to these example embodiments, frequency ranges or bandwidths.

Looking to channel 308 in FIG. 3, it is located within the channel spectrum such that it overlaps the LO frequency for BIN2 and the boundary of BIN1 and BIN2, which are both designed to be located at about 1050 MHz. As discussed above with respect to FIG. 2C, the LO mixing frequency $f_{LO2}$ would not be used to avoid a direct down conversion of channel 308 to DC. Rather, the LO mixing frequency $f_{LO1}$ for BIN1 or the LO mixing frequency $f_{LO3}$ for BIN3 could be used to mix down the channel 308. It is noted that by having overlapping frequency bins, an LO frequency closer to the center frequency for the desired channel 308 could be used. For example, if only the non-overlapping even numbered bins 322 were provided in the embodiment 300, the next adjacent LO mixing frequency would have been LO mixing frequency $f_{LO4}$ for BIN4, which is 100 MHz from the LO mixing frequency $f_{LO2}$ for BIN2, rather than the 50 MHz frequency step between the LO frequencies for BIN2 and BIN1 and for BIN2 and BIN3. As stated above, overlapping bin architecture of FIG. 3 helps resolve boundary or inter-bin channels and helps reduce the bandwidth of the tuned signal thereby reducing the bandwidth requirements for the anti-aliasing filters and reducing the sampling rate requirements for ADC circuitry that may be used in the digital fine tune circuitry. It is noted that a similar result to the overlapping bin approach could be achieved by expanding the number of non-overlapping bins to reduce the frequency step between adjacent LO frequencies. One additional benefit of the overlapping bin architecture, however, is that more than one bin has been designated as covering the same frequency range, thereby providing a desirable level of redundancy.

Figure 4A:
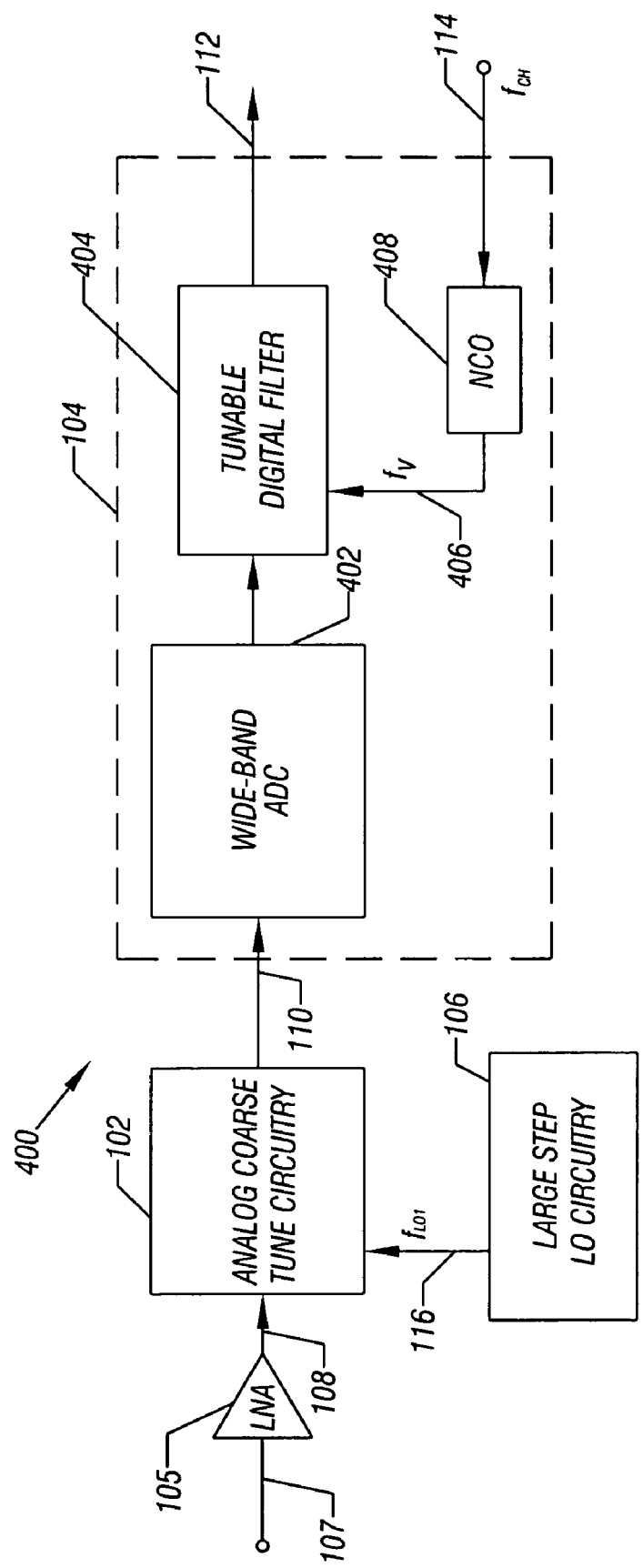
FIGS. 4A and 4B are example embodiments for the basic receiver architecture using a wide-band analog-to-digital converter and a narrow band tunable bandpass analog-to-digital converter, respectively.
Figure 4B:
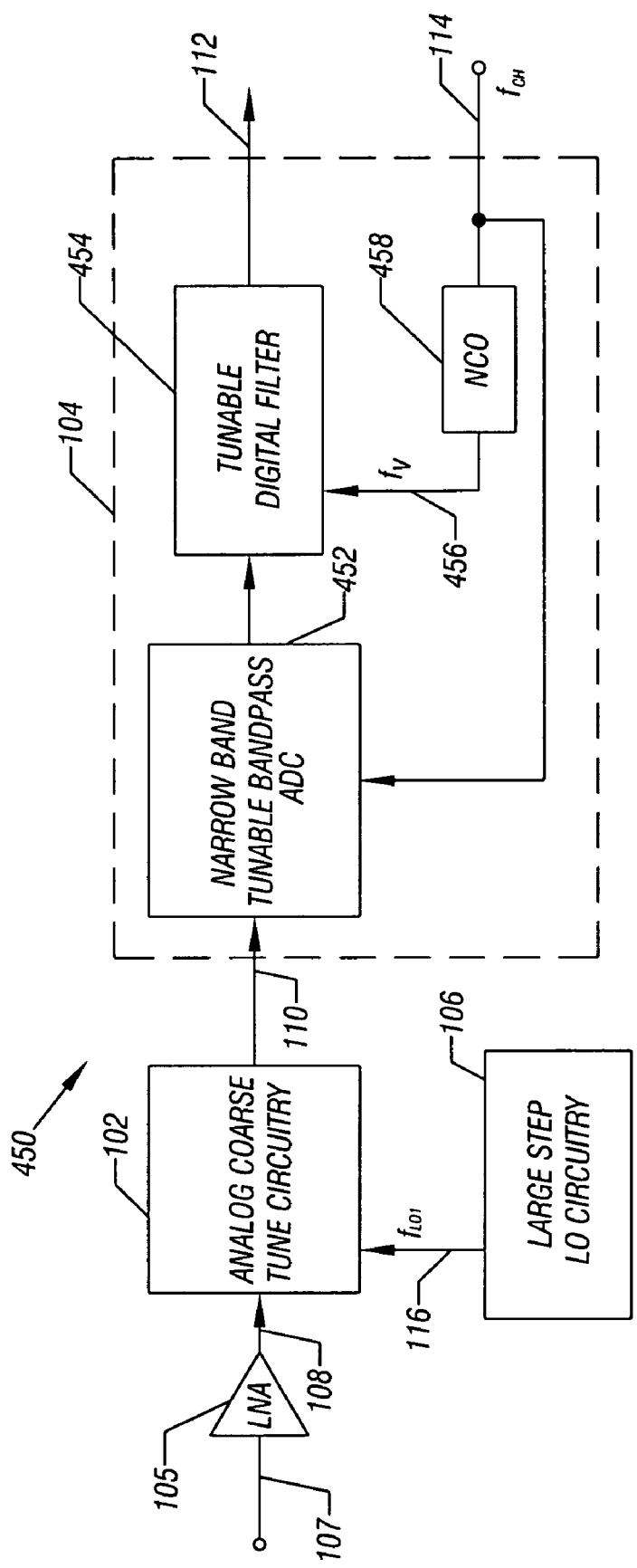

FIGS. 4A and 4B are example implementations for the basic receiver architecture using a wide-band ADC for the digital fine tune circuitry 104 and a narrow band tunable bandpass ADC for the digital fine tune circuitry 104, respectively. In particular, embodiment 400 of FIG. 4A utilizes a wide-band ADC 402 that receives coarsely tuned signal 110 and provides a digital output to a tunable digital filter 404, which in turn outputs the digital baseband signals 112. For fine tuning the desired channel within the signal 110, the tunable digital filter 404 utilizes a variable frequency ($f_V$) 406 generated, for example, by a numerically controlled oscillator (NCO) 408 that in turn receives the center frequency ($f_{CH}$) 114 for the desired channel. Embodiment 450 of FIG. 4B utilizes a narrow-band (complex or real) tunable bandpass ADC 452 that receives the coarsely tuned signal 110 and provides a digital output to a tunable digital filter 454. For tuning the digital output to the desired channel, the narrow-band bandpass ADC utilizes the center frequency ($f_{CH}$) 114 for the desired channel. Additional tuning of the desired channel is provided by the tunable digital filter 454, which utilizes a variable frequency ($f_V$) 456 generated, for example, by a numerically controlled oscillator (NCO) 458 that in turn receives the center frequency ($f_{CH}$) 114 for the desired channel. It is noted that these implementations for providing fine tuning of the coarsely tuned channel spectrum do not mix the desired channel down to a fixed target IF frequency and do not mix the desired channel to DC. Rather, these implementations use the analog coarse tune circuitry 102 to mix the desired channel down to a variable location within a frequency range around DC, and then they perform digital conversion and digital filtering directly on this coarsely tuned channel spectrum.

Figure 5A:
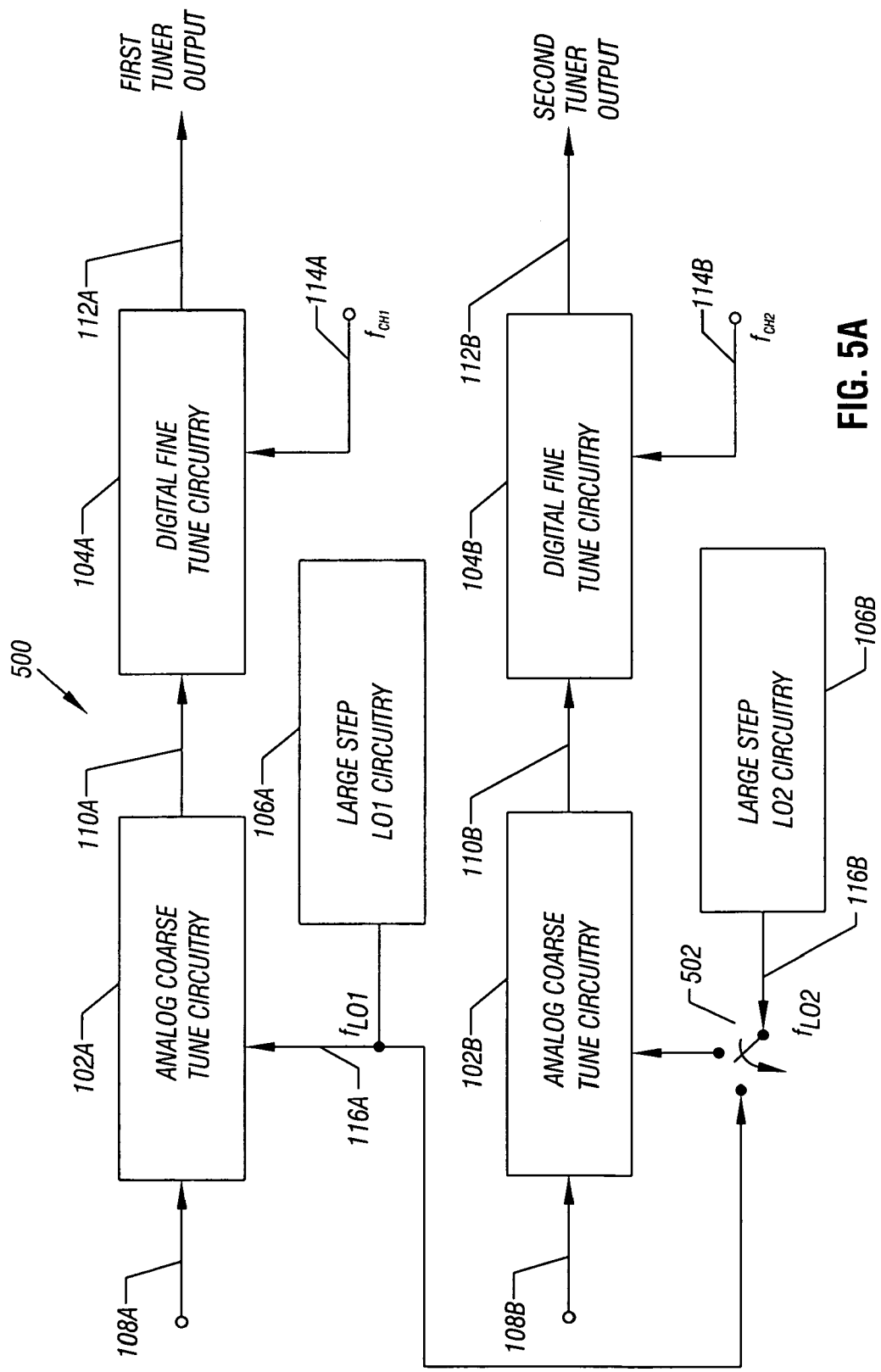
FIG. 5A is a block diagram for a two receiver architecture located on a single integrated circuit.

FIG. 5A is a block diagram of an embodiment 500 for a two receiver architecture located on a single integrated circuit. In general, this embodiment 500 duplicates the circuitry of FIG. 1C to produce a dual receiver architecture. The first receiver includes analog coarse tune circuitry 102A, large-step LO1 circuitry 106A (which outputs a first LO mixing frequency ($f_{LO1}$)116A), and digital fine tune circuitry 104A (which receives a first center frequency ($f_{CH1}$) 114A for a first desired channel to be tuned). As discussed above, the first receiver coarsely tunes the input channel spectrum 108A to produce the intermediate coarsely tuned channel signal 110A and then digitally processes this signal to finely tune the channel and to produce digital baseband signals for the first tuner output 112A. Similarly, the second receiver includes analog coarse tune circuitry 102B, large-step LO2 circuitry 106B (which outputs a second LO mixing frequency ($f_{LO2}$)116B), and digital fine tune circuitry 104B (which receives a second center frequency ($f_{CH2}$) 114B for a second desired channel to be tuned). The second receiver coarsely tunes the input channel spectrum 108AB to produce the intermediate coarsely tuned channel signal 110B and then digitally processes this signal to finely tune the channel to produce digital baseband signals for the second tuner output 112B. It is noted that the two tuner embodiments discussed herein are example multi-tuner satellite receiver embodiments and that the architecture of the present invention could be utilized to integrate additional receivers within a single integrated circuit.

Because there are two local oscillators on a single integrated circuit in the embodiment 300 of FIG. 5A, it is possible that the same LO mixing frequency may be selected for use by each of the two receivers, such that $f_{LO1}=f_{LO2}$. In such a case, unless these two frequencies can be precisely matched, they will likely interfere with each other. As one solution to this problem, the dual receiver architecture can be implemented such that the two receivers share a single LO mixing frequency in circumstances where the same LO mixing frequency is in fact selected for use by each of the two receivers ($f_{LO1}=f_{LO2}$). In the embodiment 500 of FIG. 5A, the switch 502 is provided so that the receivers can share the first LO mixing frequency ($f_{LO1}$) in such circumstances. One problem that remains, however, is how to keep the second large-step LO2 circuitry 106B from attempting to output an interfering mixing frequency. Possible solutions to this problem include (1) turning off the second receive path and sharing the first tuner output, (2) turning off the second large-step LO2 circuitry 106B and sharing the first LO mixing frequency ($f_{LO1}$), for example, using a controlled switch 502 as shown in FIG. 5A, or (3) sharing the first LO mixing frequency ($f_{LO1}$) and also causing the large-step LO2 circuitry 106B to move to a non-interfering LO mixing frequency ($f_{LO2}$) that will not be used while the first LO mixing frequency ($f_{LO1}$) is being shared. It is further noted that other techniques and solutions could be implemented, if desired, for addressing the problem of circumstances where the second LO mixing frequency and the first LO mixing frequency would overlap. It is also again noted that the architecture of the present invention could be utilized to integrate additional receivers within a single integrated circuit. For example, if four tuners were utilized, additional receiver circuitry could be integrated with that shown in FIG. 5A to provide additional analog coarse tuning circuitry, digital fine tuning circuitry and LO circuitry for a third receiver and additional analog coarse tuning circuitry, digital fine tuning circuitry and LO circuitry for a fourth receiver. As discussed above, a variety of selection techniques could be implemented for the LO frequencies provided by the different LO circuitries with respect to the multiple receivers such that interfering overlaps of the LO mixing frequencies could be avoided.

Figure 5B:
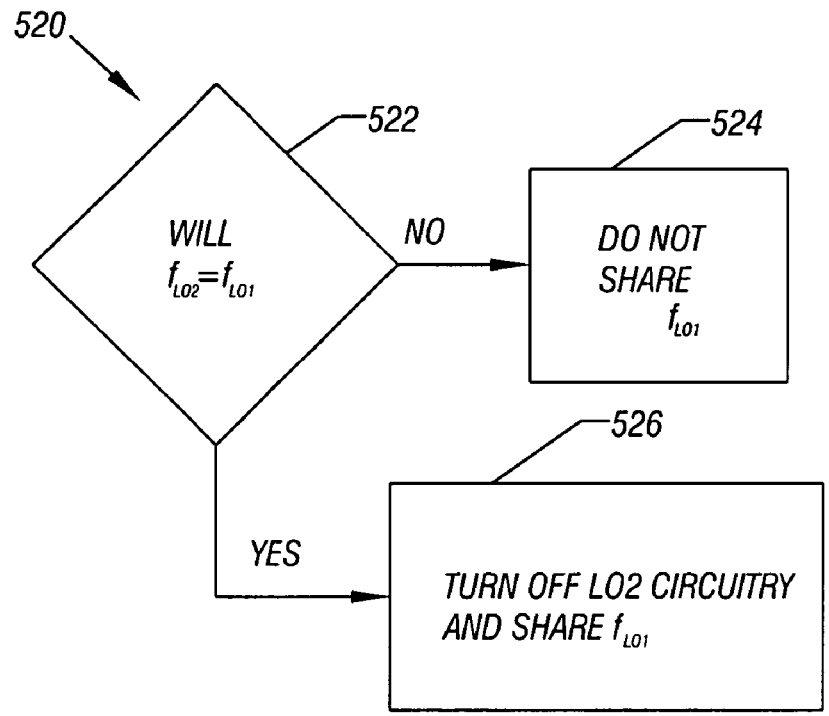
FIGS. 5B and 5C are flow diagrams of example embodiments for sharing a single local oscillator frequency between two receivers.
Figure 5C:
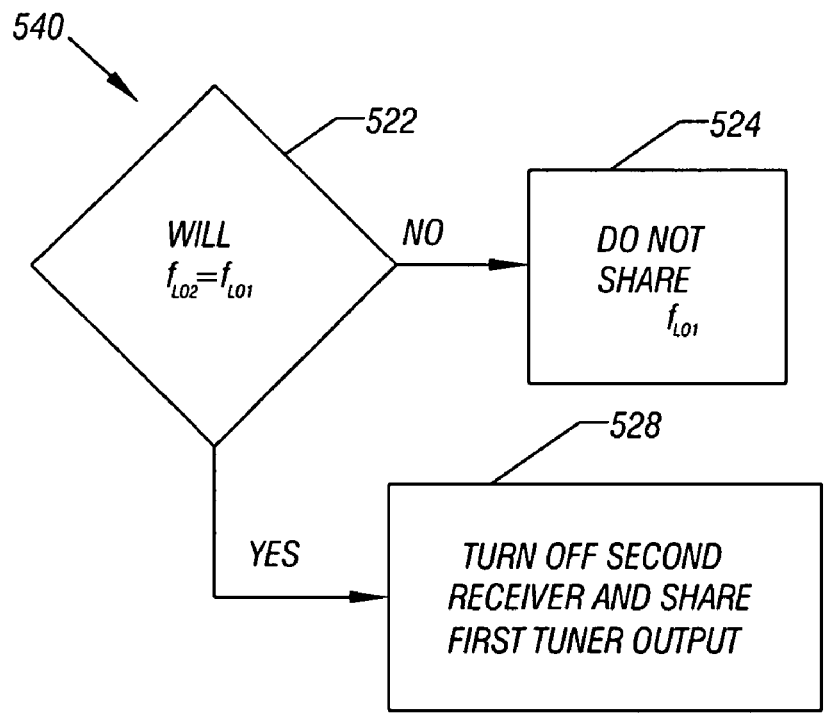

FIGS. 5B and 5C are flow diagrams of example implementations for the first two solutions above for handling the second LO frequency where a single LO frequency is shared between two receivers. In embodiment 520 of FIG. 5B, decision block 522 determines if the two selected LO mixing frequencies will be the same ($f_{LO1}=f_{LO2}$). If the answer is "YES," then in block 526, the first LO mixing frequency ($f_{LO1}$) is shared, and the second local oscillator circuitry (LO2) is powered down and turned off. If the answer is "NO," then in block 524, each LO circuitry operates, and first LO mixing frequency ($f_{LO1}$) is not shared. In the embodiment 540 of FIG. 5C, decision block 522 similarly determines if the two selected LO mixing frequencies will be the same ($f_{LO1}=f_{LO2}$). And again, if the answer is "NO," then in block 524, each LO circuitry operates, and first LO mixing frequency ($f_{LO1}$) is not shared. If the answer is "YES," then in block 528, the first tuner output 112A is shared, and the entire second receiver path circuitry is powered down and turned off.

Figure 6B:
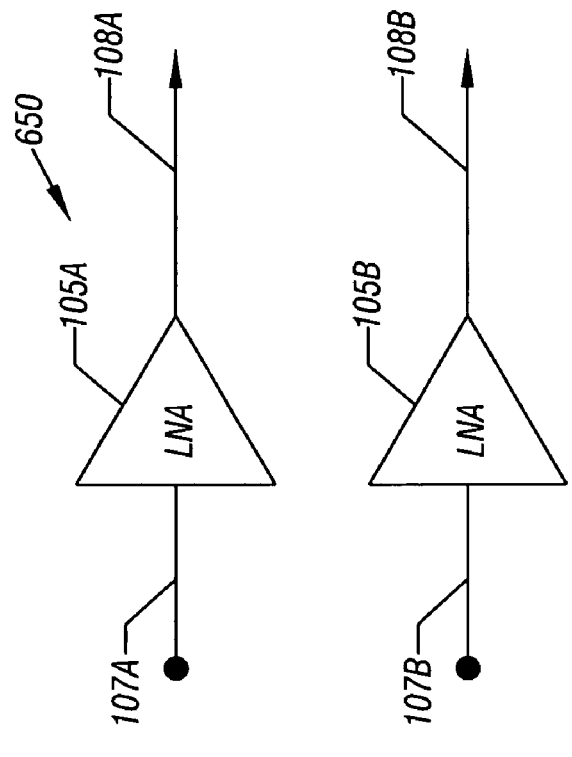
FIGS. 6A and 6B are block diagrams for example embodiments for providing satellite dish signals to satellite set-top box receivers.
Figure 6A:
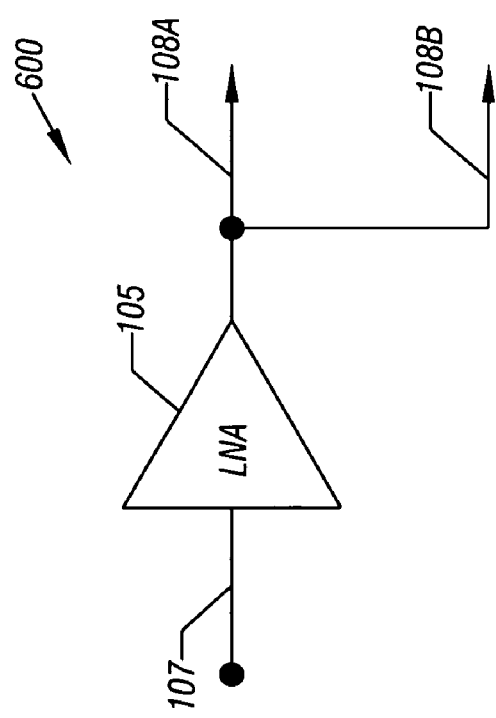

FIGS. 6A and 6B are block diagrams for example implementations for providing satellite dish signals to satellite set-top box dual receiver architectures. In FIG. 6A, there is a single incoming signal 107 from the satellite dish antenna. This incoming satellite spectrum signal 107 is received by LNA 105 and then split into two signals 108A and 108B to provide inputs to each of the two receiver paths. In FIG. 6B, there are two singles 107A and 107B coming the satellite dish antenna. These incoming signals 107A and 107B are then received by two separate LNAs 105A and 105B. LNA 105A provides an output signal 108A for a first receiver path, and LNA 105B provides an output signal 108B for a second receiver path. It is noted that with respect to the embodiment 600 of FIG. 6A, both the solutions of FIGS. 5B and 5C are available. However, with the embodiment 650 of FIG. 6B, the solution of FIG. 5C would not available because the two input satellite transponder channel spectrums 108A and 108B may not be the same and, therefore, sharing the first tuner output 112A may cause errors with respect to the output of the second receiver circuitry.

Figure 7A:
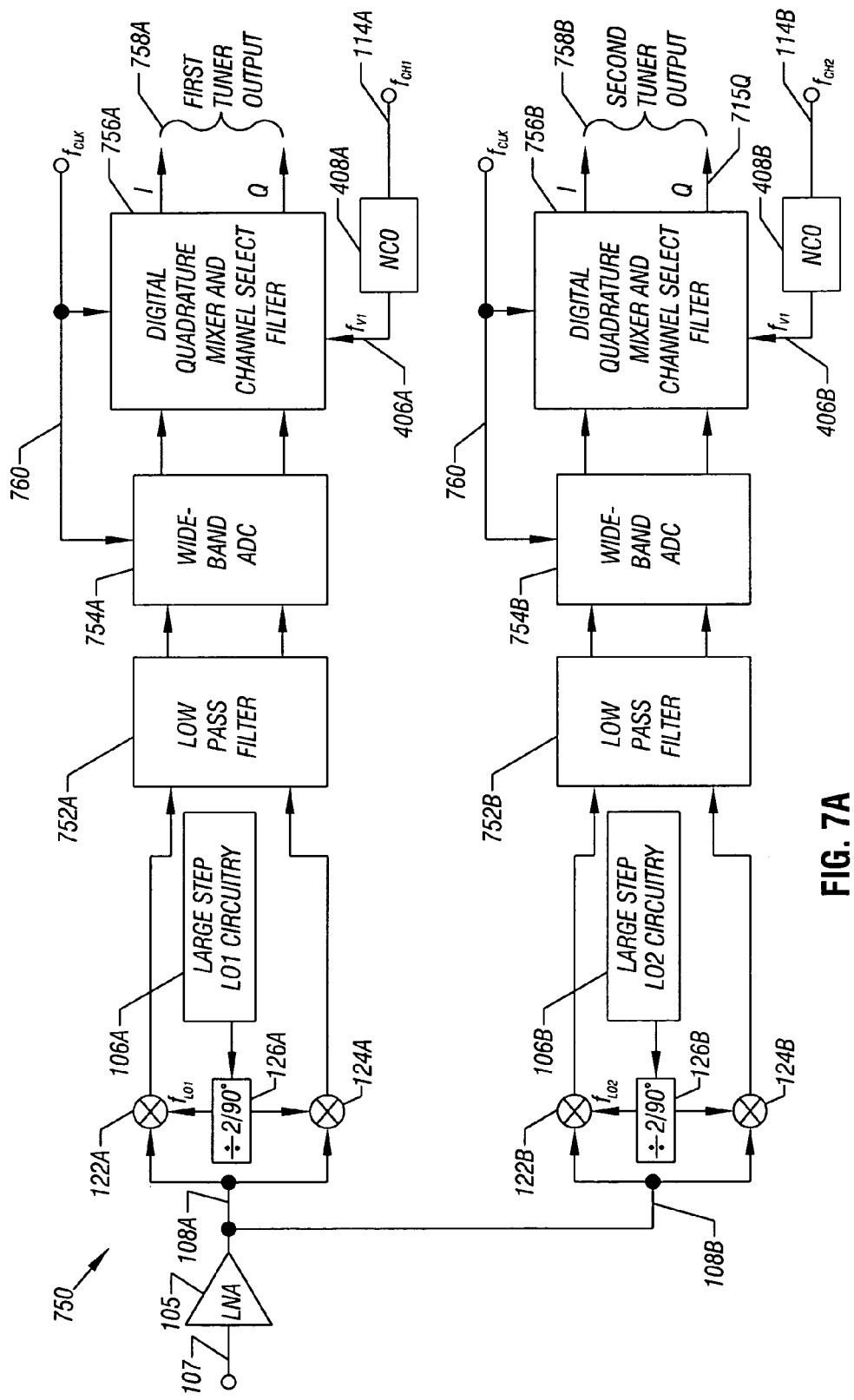
FIG. 7A is a block diagram for an dual receiver implementation of the receiver architecture of the present invention using wide-band analog-to-digital converters.

FIG. 7A is a block diagram for an dual receiver implementation of the receiver architecture of the present invention using wide-band analog-to-digital converters, such as discussed with respect to FIG. 4A above. In embodiment 750, an input signal 107 is received by LNA 105, and LNA 105 provides two input channel spectrum signals 108A and 108B to the two receiver paths. A first receiver path includes mixers 122A and 124A, 90 degree phase shift block 126A, and large-step LO1 circuitry 106A, which together output complex I/Q signals that are coarsely tuned channel spectrum signals. These complex I/Q signals are then processed by a low pass filter 752A, a wide-band ADC 754A and a digital quadrature mixer and channel select filter 756A. A sampling clock ($f_{CLK}$) 760 is provided to the wide-band ADC 754A and the digital quadrature mixer and channel select filter 756A. For fine tuning the desired channel, the digital quadrature mixer and channel select filter 756A utilizes a variable frequency ($f_{V1}$) 406A generated by numerically controlled oscillator (NCO) 408A that in turn receives the center frequency ($f_{CH1}$) 114A for a first desired channel. The first receiver path outputs quadrature I/Q baseband signals 758A as the first tuner output. A second receiver path duplicates the first receiver path and includes mixers 122B and 124B, 90 degree phase shift block 126B, large-step LO2 circuitry 106B, low pass filter 752B, a wide-band ADC 754B and a digital quadrature mixer and channel select filter 756B. As with the first receiver path, a sampling clock ($f_{CLK}$) 760 is provided to the wide-band ADC 754B and the digital quadrature mixer and channel select filter 756B. For fine tuning the desired channel, the digital quadrature mixer and channel select filter 756B utilizes a variable frequency ($f_{V2}$) 406B generated by NCO 408B that in turn receives the center frequency ($f_{CH2}$) 114B for a second desired channel. It is noted that the embodiment 750 could also have additional circuitry for handling overlaps between the first and second LO mixing frequencies ($f_{LO1}$, $f_{LO2}$), as discussed with respect to FIGS. 5A-C and 6A-B above.

Figure 7B:
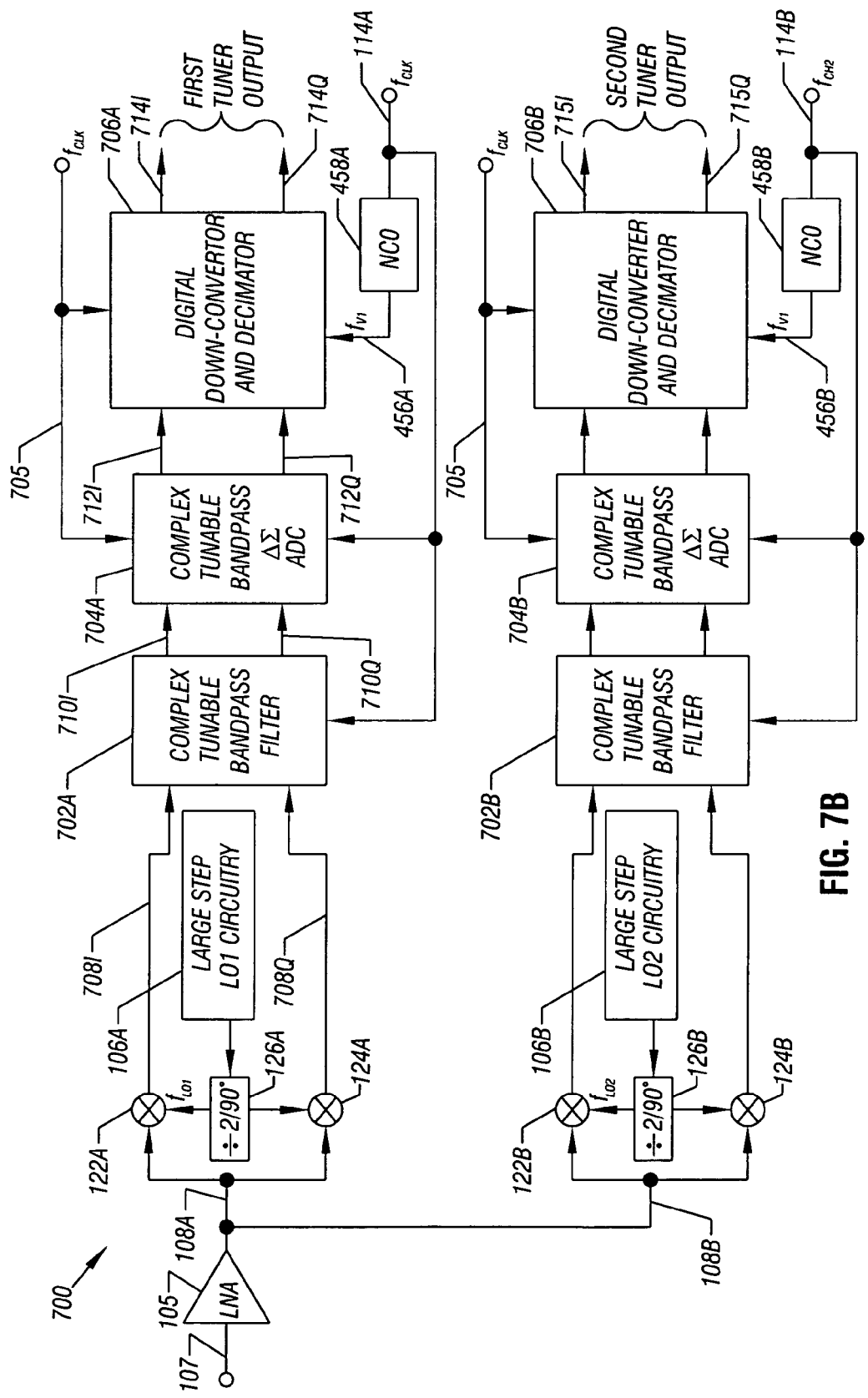
FIG. 7B is a block diagram for an dual receiver implementation of the receiver architecture of the present invention using complex tunable bandpass delta-sigma analog-to-digital converters.

FIG. 7B is a block diagram for a dual receiver implementation of the receiver architecture of the present invention using complex tunable bandpass delta-sigma analog-to-digital converters, such as discussed with respect to FIG. 4B above. In embodiment 700, an input signal 107 is received by LNA 105, and LNA 105 provides two input channel spectrum signals 108A and 108B to the two receiver paths. A first receiver path includes mixers 122A and 124A, 90 degree phase shift block 126A, and large-step LO1 circuitry 106A, which together output complex I/Q signals that are coarsely tuned channel spectrum signals 708I and 708Q. These complex I/Q signals are then processed by a complex tunable bandpass filter 702A with outputs 710I and 710Q, a complex tunable bandpass delta-sigma (ΔΣ) ADC 704A with outputs 712A and 712Q, and a digital down-converter and decimator 706A. A sampling clock ($f_{CLK}$) 705 is provided to complex tunable bandpass ΔΣ ADC 704A and to the digital down-converter and decimator 706A. For digital processing and tuning of the desired channel, the complex tunable bandpass filter 702A and the complex tunable ΔΣ ADC 704A receive the center frequency ($f_{CH1}$) 14A for a first desired channel. For further fine tuning of the desired channel, the digital down-converter and decimator 706A utilizes a variable frequency ($f_{V1}$) 456A generated by numerically controlled oscillator (NCO) 458A that in turn receives the center frequency ($f_{CH1}$) 114A. The first receiver path outputs quadrature I/Q baseband signals 714I and 714Q as the first tuner output. A second receiver path duplicates the first receiver path and includes mixers 122B and 124B, 90 degree phase shift block 126B, large-step LO2 circuitry 106B, complex tunable bandpass filter 702B, a complex tunable bandpass ΔΣ ADC 704B and a digital down-converter and decimator 706B. As with the first receiver path, a sampling clock ($f_{CLK}$) 705 is provided to the complex tunable bandpass ΔΣ ADC 704B and the digital down-converter and decimator 706B. For digital processing and tuning of the desired channel, the complex tunable bandpass filter 702B and the complex tunable ΔΣ ADC 704B receive the center frequency ($f_{CH2}$) 114B for a second desired channel. For further fine tuning of the desired channel, the digital down-converter and decimator 706B utilizes a variable frequency ($f_{V2}$) 456B generated by NCO 458B that in turn receives the center frequency ($f_{CH2}$) 114B. It is noted that the embodiment 750 could also have additional circuitry for handling overlaps between the first and second LO mixing frequencies ($f_{LO1}$, $f_{LO2}$), as discussed with respect to FIGS. 5A-C and 6A-B above.

It is noted that with respect to embodiments of FIGS. 7A and 7B, the required bandwidth for ADCs 754A/B and the tuning range for ADCs 704A/B can be limited to positive frequencies if desired. Negative frequencies can be tuned by applying the complex conjugate of the Q path signal to the filters 102A/B and 752A/B. This negative frequency conversion circuitry, therefore, can be placed after the mixers 124A/B in each of the embodiments 700 and 750. This preprocessing advantageously limits the required processing range for the complex analog processing done by the ADCs 704A/B.

Figure 7C:
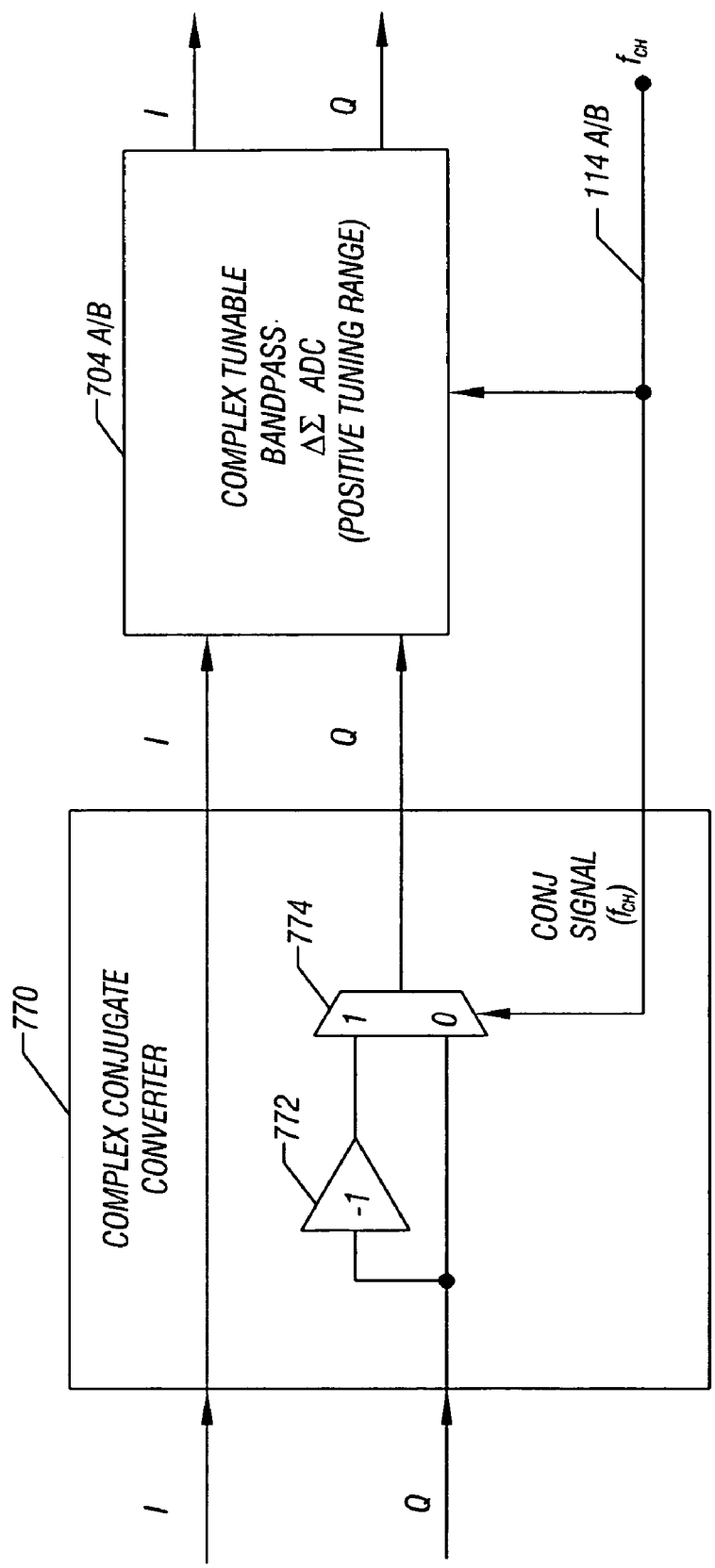
FIG. 7C is a block diagram of an example embodiment for converting negative frequencies to reduce the needed tuning range of a complex tunable bandpass to positive frequencies.

FIG. 7C provides an example embodiment for converting negative frequencies to reduce the needed tuning range of the complex tunable bandpass ΔΣ ADC 704A/B to positive frequencies. As depicted, the I and Q path signals received by the complex tunable bandpass ΔΣ ADC 704A/B are first processed by the complex conjugate converter 770. In the embodiment shown, the I path signal passes through the complex conjugate converter 770 and is provided to the complex tunable bandpass ΔΣ ADC 704A/B. The Q path signal is connected to the "0" input of the multiplexer (MUX) 774. The Q path signal is also connected to gain stage 772 (−1 gain), which in turn provides an output that is connected to the "1" input of the MUX 774. The conjugate signal (CONJ SIGNAL) used to control the MUX 774 is the center frequency ($f_{CH}$) 114A/B that is also utilized by the complex tunable bandpass ΔΣ ADC 704A/B. As stated above, by using this complex conjugate converter to process the I and Q path signals, the complex tunable bandpass ΔΣ ADC 704A/B can be advantageously limited to a positive tuning range thereby reducing the bandwidth requirement for the complex tunable bandpass ΔΣ ADC 704A/B. It is further noted that for a fully differential design, the −1 gain for gain stage 772 can be implemented relatively simply by swapping the two single-ended positive and negative signals that would be received by gain stage 772 in such a fully differential design.

Figure 8A:
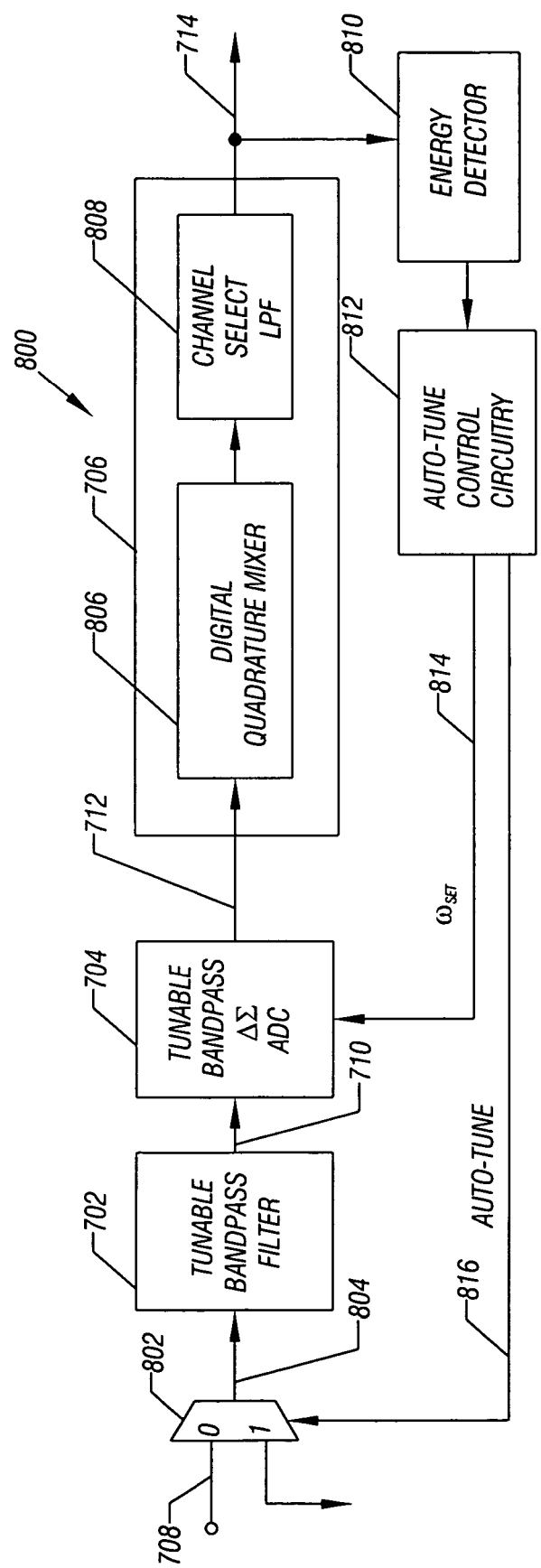
FIG. 8A is a block diagram of an embodiment for adjusting tuning errors with respect to the complex tunable bandpass delta-sigma analog-to-digital converters in the embodiment of FIG. 7B.
Figure 8B:
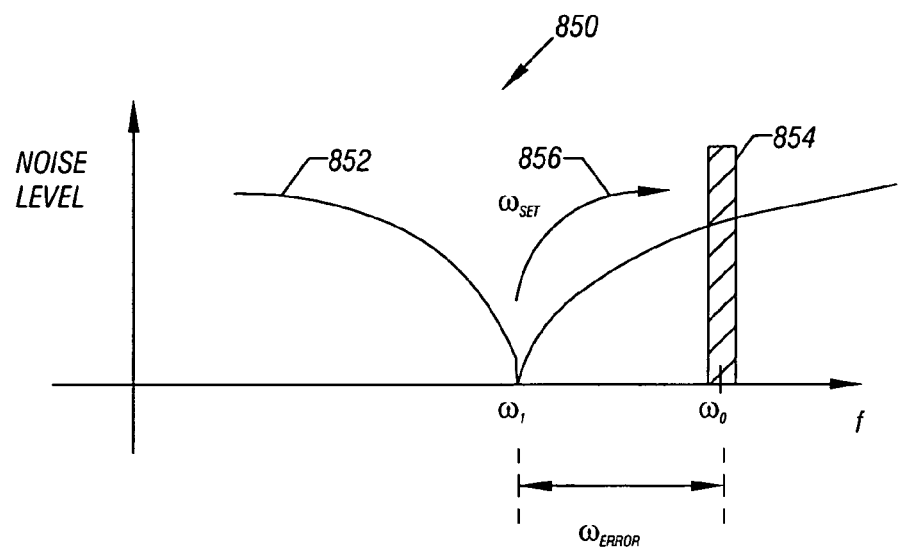
FIG. 8B is a diagram representing the signal correction of FIG. 8A.

FIG. 8A and FIG. 8B are a block diagram and response diagram, respectively, that describe one implementation for calibrating and handling tuning errors in a bandpass delta-sigma converter within a receiver, such as tunable bandpass ΔΣ ADC 704A/B in FIG. 7B. This implementation takes advantage of the result that an improperly tuned delta-sigma converter will typically produce large amounts of noise in the final output of the receiver.

Looking first to FIGS. 8A, a block diagram is depicted of an embodiment 800 for calibrating tuning errors with respect to a bandpass delta-sigma converter within a receiver, such as the complex tunable bandpass delta-sigma analog-to-digital converters in the embodiment of FIG. 7B. This embodiment 800 detects energy in the receiver output and provides a tuning offset signal ($\omega_{SET}$) that adjusts the tunable bandpass ΔΣ ADC 704 to correct for errors in its center frequency. Similar to the embodiment 700 of FIG. 7B, embodiment 800 also includes a tunable bandpass filter 702 and a digital down-converter and decimator 706, which itself includes a digital quadrature mixer 806 and a channel select low pass filter (LPF) 808. The output baseband I/Q signals 714 are sent to an energy detector 810 that determines noise in the output signal. The energy detector 810 provides an output to the auto-tune control circuitry 812. The auto-tune control circuitry 812 in turn provides the tuning offset signal ($\omega_{SET}$) to the tunable bandpass ΔΣ ADC 704. And the auto-tune control circuitry 812 also sends an auto-tune control signal 816 to a multiplexer (MUX) 802. The multiplexer 802 chooses between the channel spectrum I/Q signal 708 and ground and outputs a signal 804 to the tunable bandpass filter 702. In operation, if the ΔΣ ADC 704 is mistuned, then the noise within the output baseband I/Q signals 714 will increase. Thus, by adjusting the tuning offset signal ($\omega_{SET}$) 814 to reduce and minimize this noise, the ΔΣ ADC 704 can be tuned or calibrated to compensate for tuning errors in the ΔΣ ADC 704.

FIG. 8B is a diagram representing the signal correction of FIG. 8A. In the noise level representation 850, response line 852 represents the tuning response of the ΔΣ ADC 704. The channel 854 represents a desired channel located at a channel center frequency ($\omega_0$). The ΔΣ ADC 704 is ideally tuned so that its notch falls on the channel center frequency ($\omega_0$); however, the notch for the ΔΣ ADC 704, as shown, is located at a first frequency ($\omega_1$). The difference between the desired notch location at the channel center frequency ($\omega_0$) and the actual notch location at the first frequency ($\omega_1$) represents an error amount ($\omega_{ERROR}$) in the tuning for the ΔΣ ADC 704. As represented by line 856, the tuning offset signal ($\omega_{SET}$) acts to move the notch for the ΔΣ ADC 704 so that it more closely aligns with the channel center frequency ($\omega_0$). As depicted in FIG. 8B, the center frequency ($\omega_0$) for the desired channel 854 is offset from the notch for the ΔΣ ADC 704. In operation, the digital quadrature mixer 806 would multiply the mistuned output of the ΔΣ ADC 704 by $\exp(-j\omega_0 n)$ thereby causing significant noise in the desired output channel 854, which was selected and tuned by the channel select LPF 808. Thus, due to the tuning error ($\omega_{ERROR}$) in the ΔΣ ADC 704, the noise at the output 714 will be much greater than for circumstance where this error is adjusted so that it approaches zero.

As indicated above, the technique of FIG. 8A and FIG. 8B takes advantage of the knowledge that an improperly tuned delta-sigma converter notch will produce large amounts of noise in the channel tuned by a channel select filter 808. During auto-tune in the embodiment depicted, the input to the ΔΣ ADC 704 could be forced to zero by selecting ground through the MUX 802. The output energy can then be minimized by adjusting the tuning offset signal ($\omega_{SET}$) 814 and thereby adjusting the tuning error ($\omega_{ERROR}$). Once a minimum is found, the auto tuning or calibration could be completed and normal operation could proceed by changing the selection of MUX 802 to the input channel spectrum I/Q signal 708. It is noted that a auto-tune algorithm could implemented utilizing 30 to 60 discrete settings for the tuning offset signal ($\omega_{SET}$) 814, such that the auto-tune algorithm could be executed very rapidly. In addition, the auto-tune algorithm could be executed each time a different channel were selected. And this auto-tune procedure and implementation could also be used to calibrate a bandpass filter, such as tunable bandpass filter 702, that sits in front of the ΔΣ ADC 704. In this case, a master-slave approach could be used, if desired, such that the filter is constructed using similar (or matched) complex integrators as used by the circuitry of the ΔΣ ADC 704, as discussed below with respect to FIG. 8C. It is further noted that the clock provided to the device that drives the sampling of the ΔΣ ADC 704 and the digital quadrature mixer 806 can be used as an accurate time reference for the auto-tune implementation.

Figure 8C:
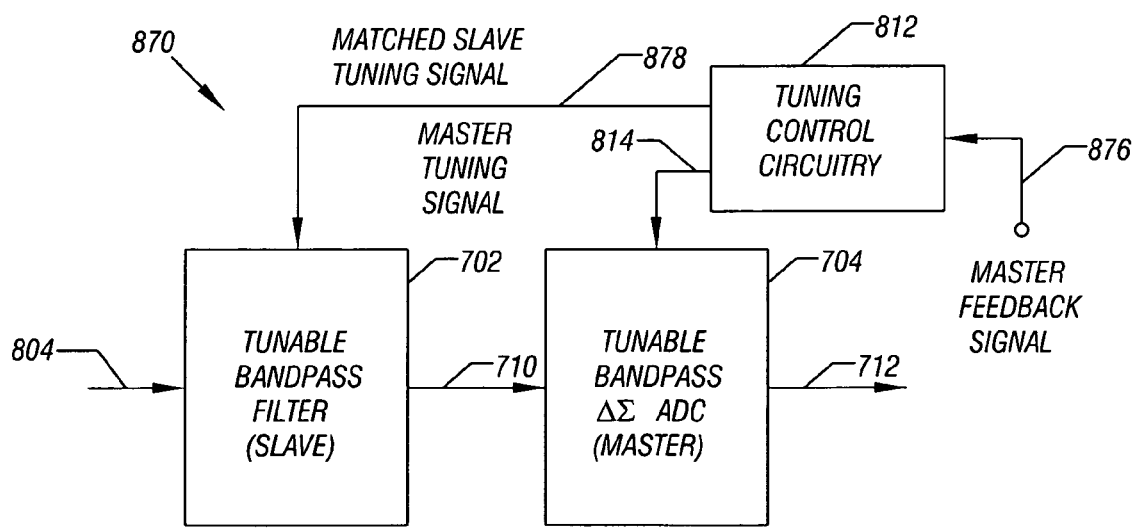
FIG. 8C is a block diagram for a master-slave tuning arrangement between a tunable bandpass analog-to-digital converter (master) and a tunable bandpass filter (slave).

FIG. 8C is a block diagram for a master-slave tuning arrangement between a tunable bandpass analog-to-digital converter (master) and a tunable bandpass filter (slave). In general, master-slave tuning of second circuit (slave) based upon a first circuit (master) is typically implemented by building the second circuit out of similar or identical circuit building blocks as the first circuit. One can then fine tune the building blocks of the first circuit through a feedback methodology. The control (or offset) signals which are derived out of the feed back methodology are applied not only to the first circuit but also to the second circuit as well. Because the second circuit was not a part of this feed back operation, the second circuit can be tuned by the notion of similarity (or matching). The second circuit, in this case, is called the slave whereas the first circuit involved in the feedback operation is called the master. Usually, the circuit selected as the master circuit will have a topology that is reasonably amenable to a feedback methodology where as the circuit selected as the slave circuit is often not amenable to a feedback operation. One typical example of a master-slave tuning implementation is fine tuning of a filter by slaving it into an oscillator which has the same integrators.

Looking back to FIG. 8C, the embodiment depicted utilizes the tunable bandpass ΔΣ ADC 704 as the master tuning circuit that allows for fine tuning of the tunable bandpass filter 702, which is the slave circuit. To implement this master-slave approach, for example, the tunable bandpass ΔΣ ADC 704 can be built out of identical or similar complex integrators as used for the filter 702. In operation, some feedback operation is conducted on the output 712 of the tunable bandpass ΔΣ ADC 704, and a master feedback signal 876 is produced. This master feedback signal 876 is applied to the tuning control circuitry 812, which in turn provides a master tuning signal 814 to the tunable bandpass ΔΣ ADC 704. This feedback operation, for example, may be the energy detection implementation discussed above with respect to FIGS. 8A and 8B. In addition, the master tuning signal 814 may be the tuning offset signal ($\omega_{SET}$) 814, and the input signal to the tunable bandpass filter 702 could be the input signal 804, as discussed above with respect to FIGS. 8A and 8B. Once the feedback operation and the tuning control circuitry has tuned the tunable bandpass ΔΣ ADC 704, the master tuning signal 814 is the applied by similarity (or matching) to the tunable bandpass filter 702 as the matched slave tuning signal 878.

FIGS. 9A-9E are block and signal diagrams that describe implementations for the digital down-converter and decimator 706A/B of FIG. 7B. These implementations utilize multiple stages of digital mixing and down conversion to bring the output 712 of the bandpass ΔΣ ADC 704A/B to baseband I/Q signals. The output 712 of the bandpass ΔΣ ADC 704A/B, for example, can be a complex 1-bit digital signal sampled at $F_S$ with quantization noise shaping designed to have a minimum centered at the desired channel center frequency ($\omega_0$). The multi-staged implementation incrementally filters and decimates this signal to reduce the design requirements of each stage.

Figure 9A:
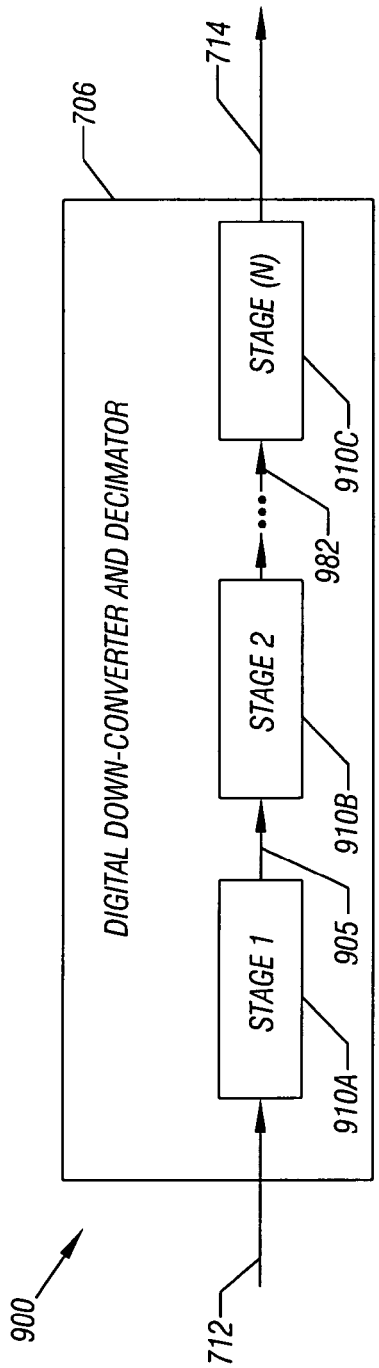
FIG. 9A is a block diagram of a multi-stage architecture for a digital down-converter and decimator usable in the embodiment of FIG. 7B.

FIG. 9A is a block diagram of the multi-stage architecture 900 for a digital down-converter and decimator 706 usable in the embodiment 700 of FIG. 7B. The input 712 from a band-pass ΔΣ ADC 704 is processed by a series of cascaded stages, which as shown include STAGE1 910A, STAGE2 910B . . . STAGE(N) 910C. Each stage provides an output to the next stage, as indicated by signal 905 from STAGE1 910A to STAGE2 910B and by signal 982 that would be from STAGE (N-1) to STAGE(N) 910C. It is noted that the stages 910A, 910B . . . 910C (STAGE1, STAGE2 . . . STAGE(N)) could all be implemented with similar circuitry, if desired.

Figure 9B:
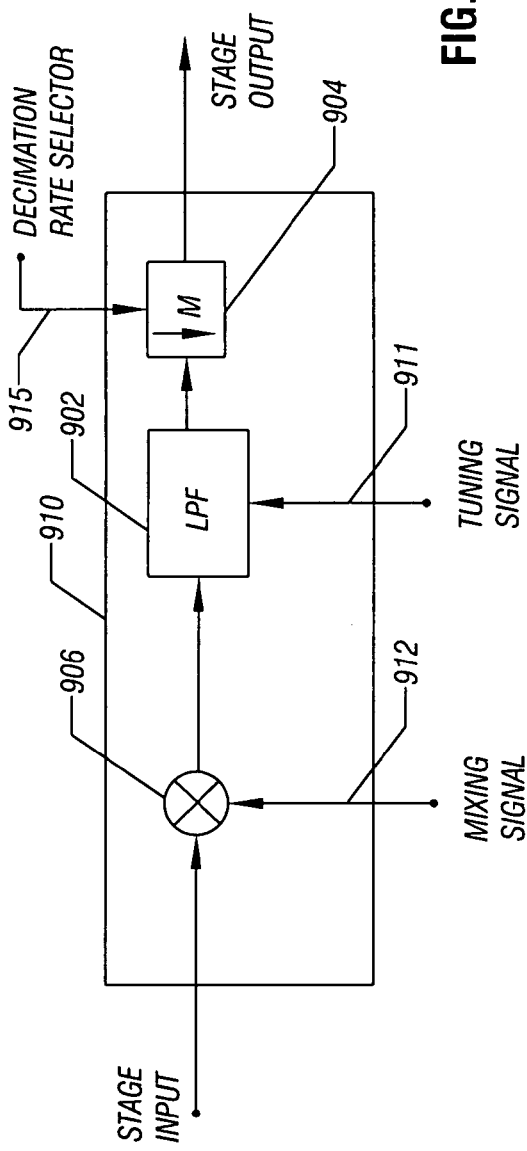
FIG. 9B is a block diagram of example stages for the architecture of FIG. 9A.

FIG. 9B is a block diagram of example circuitry for stages 910 within the multi-stage architecture of FIG. 9A. In the stage embodiment depicted, the stage input is received by mixer 906, which digitally mixes the stage input with a mixing signal 912. The resulting signal is passed through a low pass filter (LPF) 902. This LPF 902 can be tunable, if desired, and the tuning signal 911 can be used to tune the tunable LPF 902. The output of the LPF 902 is then decimated down by decimator 904 to provide the stage output. The decimator 904 can have a fixed decimation rate, if desired, or can have a variable decimation rate (down-by-M) that is controlled by decimation rate selector signal 915. The output signal from the stage 910 is then sent to the next stage. For example, where the stage is the STAGE1 910A, the input signal to the stage would be signal 712 from the ΔΣ ADC 704, and the output signal would be signal 905 that is received by STAGE2 910B. It is noted that the values for the digital mixing signal 912 and the decimation rate for the decimator 904 in each stage can be selected, as desired, depending upon the spectrum segmentation strategy selected.

Figure 9C:
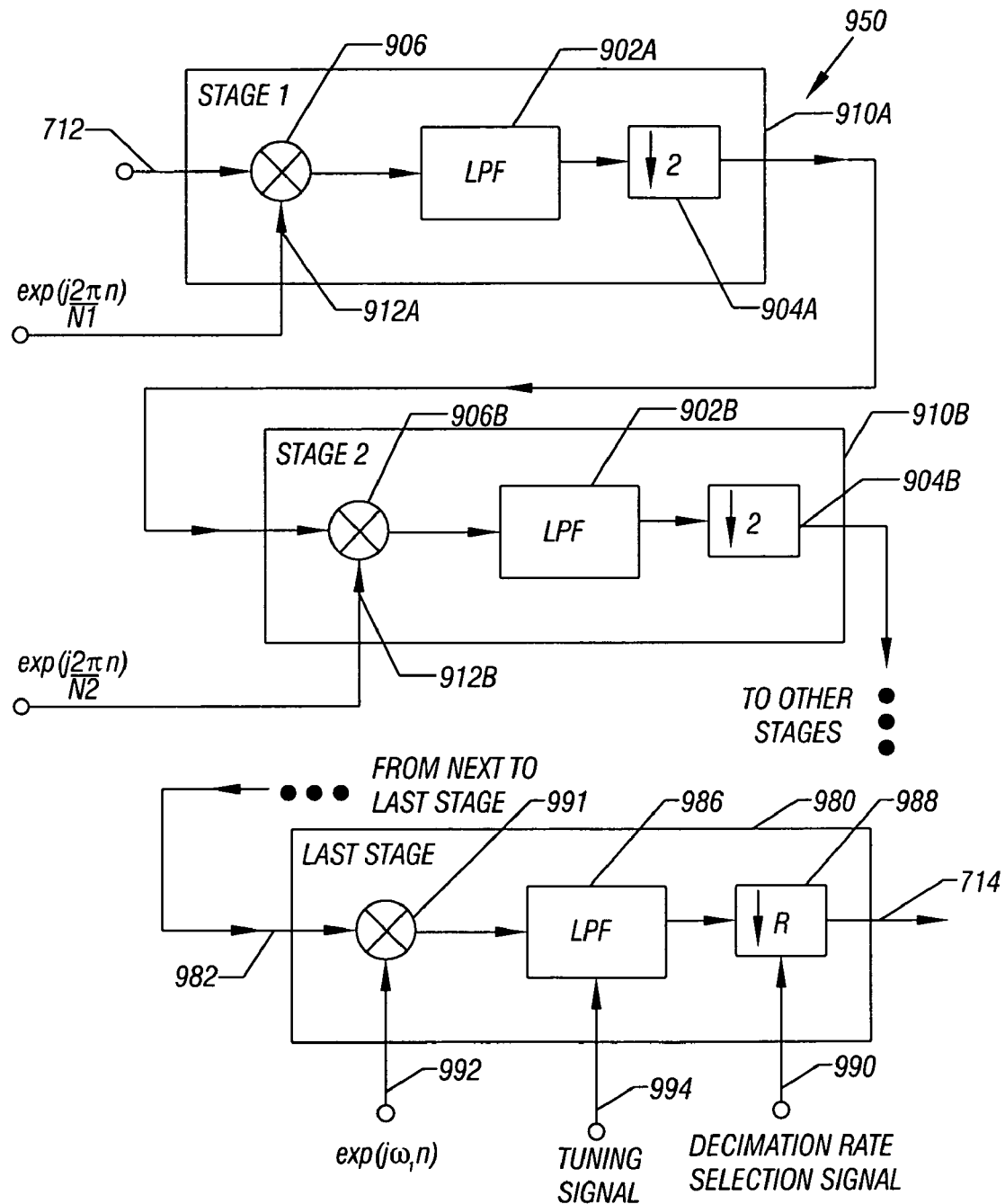
FIG. 9C is a block diagram of example implementation of the architecture of FIG. 9A utilizing a fixed decimation in the non-final stages and a variable decimation rate in the final stage.
Figure 9D:
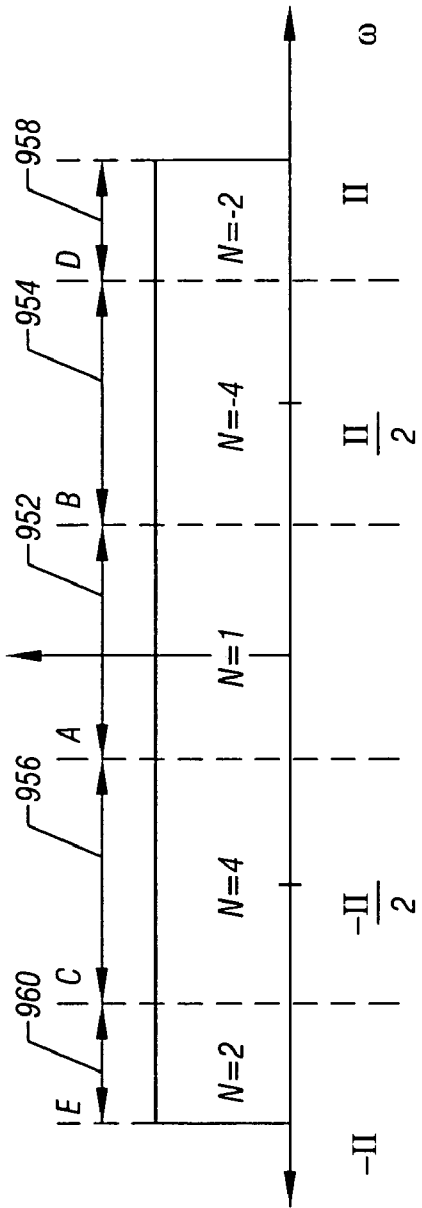
FIG. 9D is a diagram for determining a factor (N) used in the non-final stage implementations of FIG. 9C.
Figure 9E:
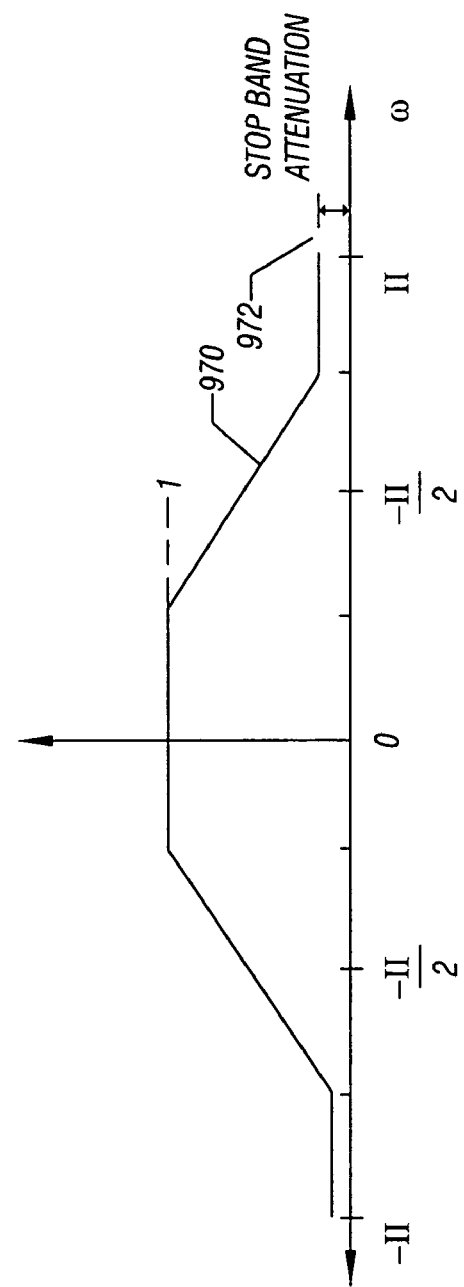
FIG. 9E is a response diagram of an example low pass filter for the non-final stage implementations of FIG. 9C.

FIGS. 9C, 9D and 9E described an example implementation of the multi-stage architecture of FIG. 9A utilizing a plurality of identical or similar non-final stages followed by a final stage that brings the signal down to a desired or optimal signal processing rate.

First, looking to FIG. 9C, a block diagram is depicted for example implementation 950 of the architecture of FIG. 9A utilizing a fixed decimation rate in non-final stages and a variable decimation rate in the final stage. In this embodiment 950, the fixed decimation rate stages, or non-tunable stages, include one or more cascaded stages. There are two example non-final, non-tunable stages depicted, namely STAGE1 910A and STAGE2 910B. STAGE1 910A receives the input signal 712 processes it with mixer 906A, LPF 902A and down-by-two decimator 904A before providing an output signal to the next stage. STAGE2 910B uses the same or similar structure and processes the signal from STAGE1 910A with mixer 906B, LPF 902B and down-by-two decimator 904B before providing an output signal to the next stage. In the embodiment depicted, the mixers 906A, 906B digitally mix their respective input signals with mixing signals 912A, 912B, and these mixing signals 912A, 912B . . . used by each stage are represented by the formula: $\exp[j(2\pi/N)n]$ where N={±1, ±2, ±4} and where "n" represents the time sequence index. In addition, as shown in FIG. 9C, each stage can use a different exponential source as a mixing signal with each mixing signal using a different N, such as N1 for mixing signal 912A, N2 for mixing signal 912B, and so on, where N1, N2, . . . ={±1, ±2, ±4}. As discussed further below with respect to FIG. 9D, for each non-tunable stage in FIG. 9C, the digital mixer 906 for the stage can be configured to digital mix the input to the stage with a mixing signal selected from a plurality of predetermined mixing signals that are chosen to reduce complexity for calculations used for the digital mixing. In addition, the mixing signal selected for a particular stage (as determined in this embodiment with N1 for stage 910A, N2 for stage 910B, and so on) can be made to depend upon the location of the channel center frequency within the input signal to the stage so that the spectrum for the input signal is rotated such that the desired channel falls within a desired frequency range.

For the last stage 980, the input signal 982 from the next to last stage is first processed by mixer 992, which digitally mixes the signal 982 with a mixing signal 992 represented by the formula: $\exp[j\omega_1 n]$ where "$\omega_1$" represents the frequency of the desired channel and where "n" represents the time sequence index. The resulting mixed signal is then sent to LPF 986, which may be a tunable LPF, if desired. If tunable, the LPF 986 can be tuned utilizing the tuning signal 994. The output from LPF 986 is then decimated by variable decimator 988 (divide-by-R). A decimation rate selection signal 990 provides a control signal to the variable decimator 988 to determine its decimation rate. The resulting output signal 714 provides the output baseband I/Q signals for the embodiment 700 of FIG. 7B.

FIG. 9D is a diagram for determining a factor (N) used in the non-final stage implementations of FIG. 9C based upon the frequency location (ω) of the desired channel. Frequency ranges 952, 954, 956, 958 and 960 represent various ranges within which a desired channel may be located within the output of the bandpass ΔΣ ADC 704. Depending upon the frequency range within which the desired channel falls, the value for "N" will be set to a particular value for the equation that describes the mixing signal 912. Region A, represented by range 952, spans from −π/4 to π/4 and uses N=1. Region B, represented by range 954, spans from π/4 to 3π/4 and uses N=−4. Region C, represented by range 956, spans from −3π/4 to −π/4 and uses N=4. Region D, represented by range 958, spans from 3π/4 to π and uses N=−2. And region E, represented by range 960, spans from −π to −3π/4 and uses N=2. Advantageously, for this implementation, the digital multiplies that must occur in digital mixer 906 are relatively trivial:

$$N=\pm 1: \exp[j2\pi n] = \ldots 1, 1, 1, 1,$$

$$N=\pm 2: \exp[\pm j\pi n] = \ldots 1, -1, 1, -1,$$

$$N=+4: \exp[j(\pi/2)n] = \ldots 1, j, 1, -j,$$

$$N=-4: \exp[j(\pi/2)n] = \ldots 1, -j, -1, j,$$

In operation, the desired channel will lie somewhere in the range of frequencies defined by regions A, B, C, D and E. Because the location of the channel is known, the value for "N" can be set to the proper value, as indicated above, such that after multiplication in digital mixer 906, the spectrum is rotated and the desired channel is within region A.

FIG. 9E is a response diagram of an example low pass filter 902 for the non-final stage implementations of FIG. 9C. The line 970 represents the relevant response for the LPF 902 depending upon the frequency location (ω) of the desired channel. The gap 972 represents a stop band attenuation for the LPF 902.

In operation, the multi-stage implementation 950 described with respect to FIGS. 9C, 9D and 9E uses a plurality of non-final cascaded stages that each include digital mixers to multiply the output of the ΔΣ ADC 704 in order to center the signal near ω=0 and that each applies the mixer output to a low pass filter and a down-by-two decimator. The final stage is designed to have variable decimation so that the channel to be tuned is finally decimated to the baseband rate. Advantageously, by breaking up the digital mixing into multiple stages, this implementation reduces power requirements at the highest sample rates, reduces the resolution required for the digital mixers, and reduces the complexity of each stage including the final stage.

Figure 10:
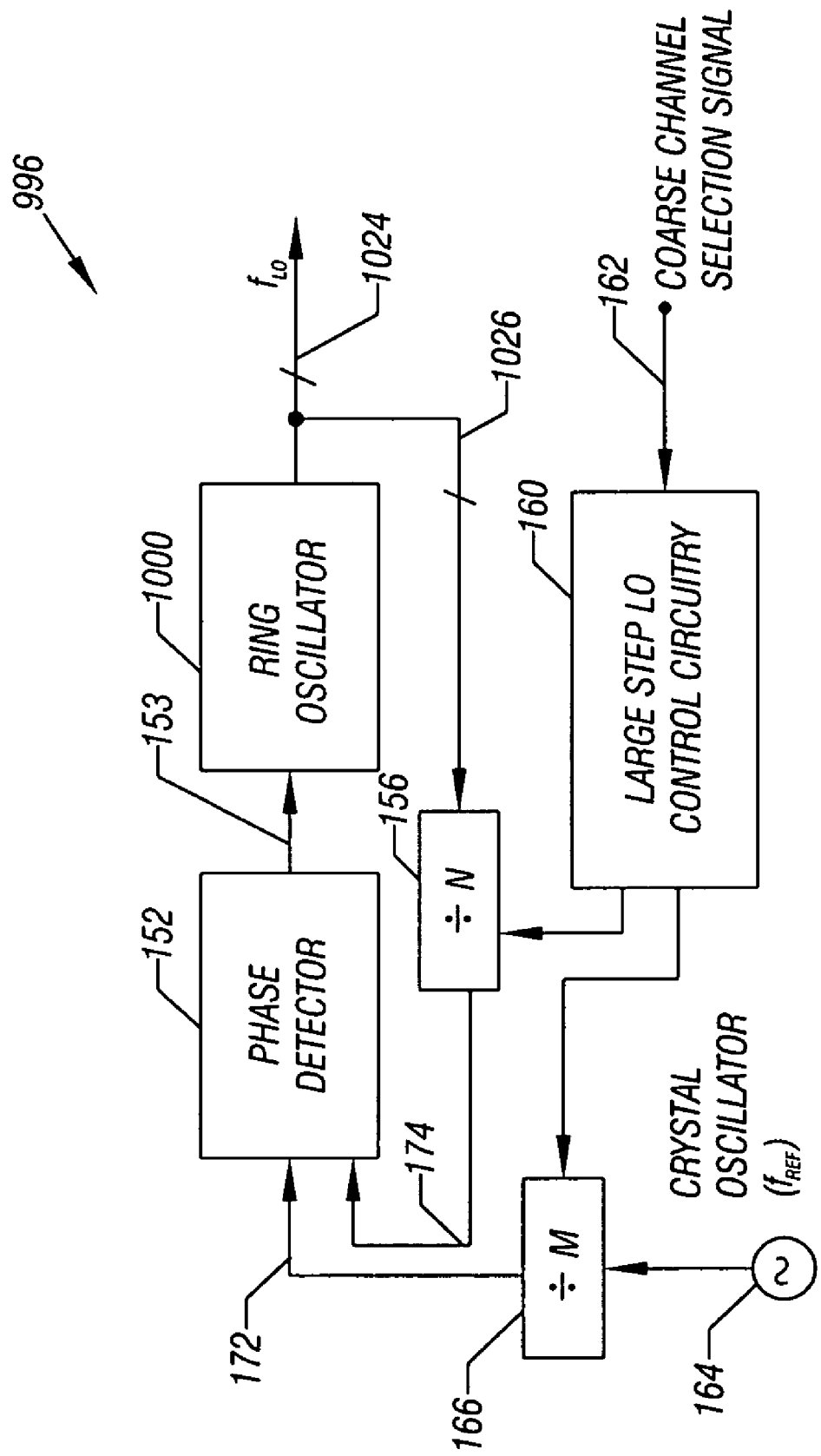
FIG. 10 is a block diagram of large-step local oscillator circuitry that includes a ring oscillator according to an embodiment of the invention.

Referring to FIG. 10, in accordance with some embodiments of the invention, large step local oscillator (LO) circuitry 996 uses a ring oscillator 1000 as its controlled oscillator for purposes of generating the $f_{LO}$ local frequency signal. The large step LO circuitry 996 otherwise has the same general design as the large step LO circuitry 106 that is depicted in FIG. 1E, with the ring oscillator 1000 (FIG. 10) being a specific version of the controlled oscillator 154. Due to the use of the ring oscillator 1000, magnetic coupling problems are avoided (as compared to an LC oscillator, for example) because the ring oscillator 1000 does not have an inductive element. The ring oscillator 1000 has a relatively wide tuning range (as required by the wide spectrum input signal), and precise frequency tuning is not needed given the relatively large frequency steps between the coarse-tune mixing signals that are generated by the LO circuitry 996.

Figure 11:
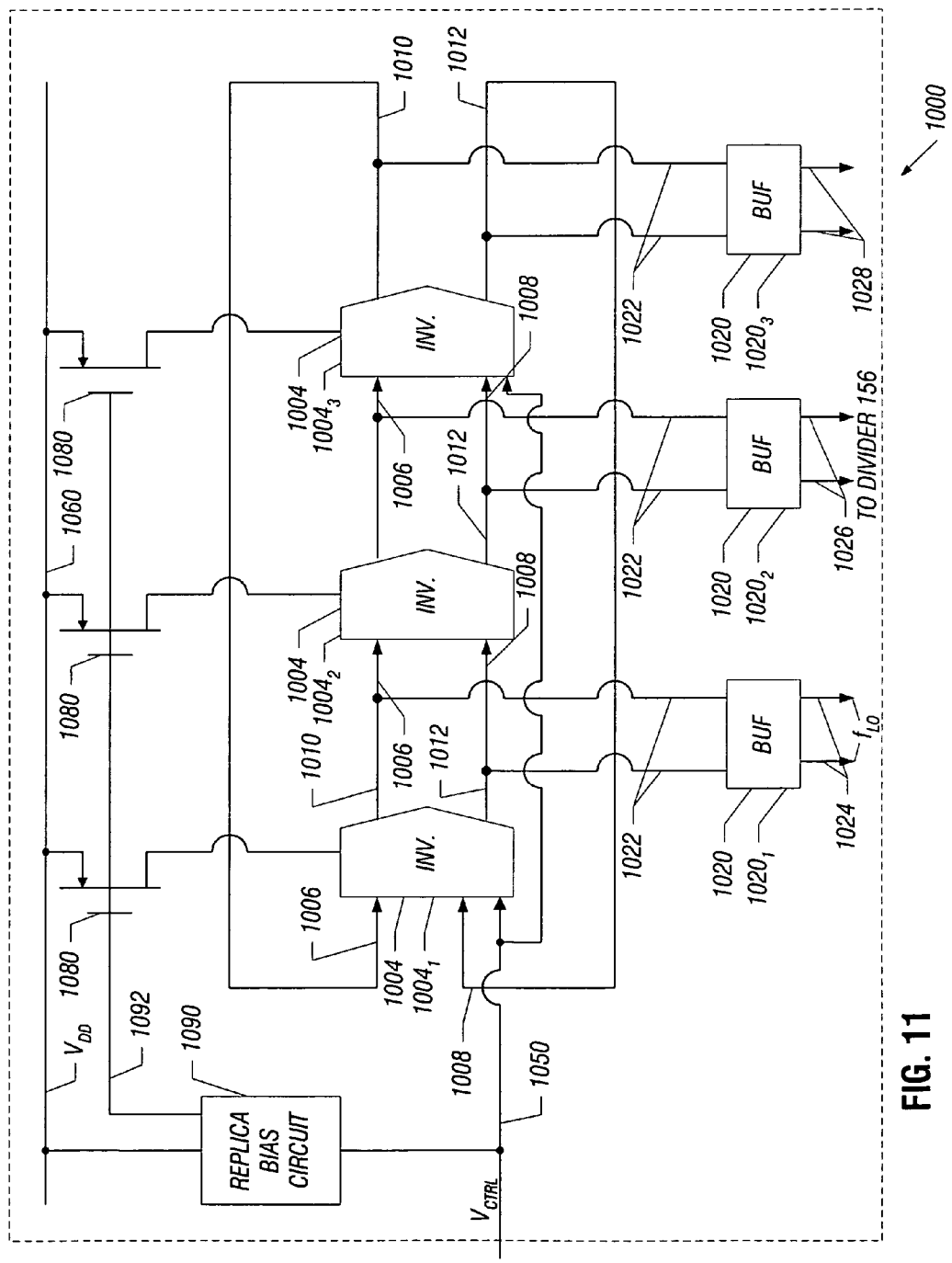
FIG. 11 is a schematic diagram of the ring oscillator of FIG. 10 according to an embodiment of the invention.

Referring to FIG. 11, in accordance with some embodiments of the invention, the ring oscillator 1000 is formed from three inverters 1004 ($1004_1$, $1004_2$ and $1004_3$) that may, for example, operate over a 2.24 to 4.48 GHz frequency range. Multi-GHz oscillators typically use small devices that result in large mismatches between adjacent ring inverters. Therefore, this prevents a direct quadrature LO clock generation with an even number of ring stages. Therefore, in accordance with some embodiments of the invention, the three ring inverter architecture is used. This architecture minimizes power consumption and minimizes phase noise.

In accordance with some embodiments of the invention, the ring oscillator 1000 has a differential inverter architecture, which is useful for rejecting supply and substrate noise (as happens in large mix signal integrated circuits). Each inverter 1004 has a differential input and a differential output in some embodiments of the invention. More specifically, as depicted in FIG. 11, each inverter 1004 has two output terminals 1010 and 1012 that provide a differential output signal. This differential output signal, in turn, is provided as a differential input signal to input terminals 1006 and 1008 of another inverter 1004 of the ring. For the specific example shown in FIG. 11, the inverter $1004_1$ receives the differential output signal from the inverter $1004_3$; the inverter $1004_2$ receives the differential output signal that is provided by the inverter $1004_1$; and the inverter $1004_3$ receives the differential output signal that is provided by the inverter $1004_2$.

The locking of the ring oscillator 1000 to a particular frequency is accomplished through the use of the $V_{CTRL}$ control signal, which is generated by the phase detector 152 (see FIG. 10). Each inverter 1004 is coupled to a control line 1050 that communicates the $V_{CTRL}$ signal to the inverters 1004.

As also shown in FIG. 11, the ring oscillator 1000 may include output buffers 1020 (buffers $1020_1$, $1020_2$ and $1020_3$, being depicted in FIG. 11 as examples). In this regard, to maintain symmetric loading, one buffer 1020 may be coupled to the output terminals 1010 and 1012 of each inverter 1004. More specifically, the buffer $1020_1$ (coupled to the output terminals 1010 and 1012 of the inverter $1004_1$) has output terminals 1024 that provide the $f_{LO}$ local oscillator signal; and the buffer $1020_2$ (coupled to the output terminals 1010 and 1012 of the inverter $1004_2$) has output terminals 1026 that provide a feedback signal to the PLL frequency divider 156 (see FIG. 10). As also depicted in FIG. 11, the buffer $1020_3$ may be coupled to the output terminals 1010 and 1012 of the inverter $1004_3$ to provide another indication of a frequency signal (at its output terminals 1028) for such purposes as testing operation of the ring oscillator 1000.

In accordance with some embodiments of the invention, the ring oscillator 1000 also includes circuitry to bias the inverters 1004. More specifically, in accordance with some embodiments of the invention, the bias circuitry includes a replica bias circuit 1090 that generates a bias control voltage (at an output terminal 1092) in response to the $V_{CTRL}$ signal. In this regard, the terminal 1092 may be coupled to gate terminals of p-channel metal-oxide-semiconductor field effect transistors (PMOSFETs) 1080. Each PMOSFET 1080 is associated with one of the inverters 1004 and has its source terminal coupled to a supply rail 1060 that furnishes a supply voltage (called "$V_{DD}$" in FIG. 11). The drain terminal of each PMOSFET 1080 provides a corresponding bias current to the associated inverter 1004, and this bias current is a function of the $V_{CTRL}$ control signal, as further described below.

Figure 12:
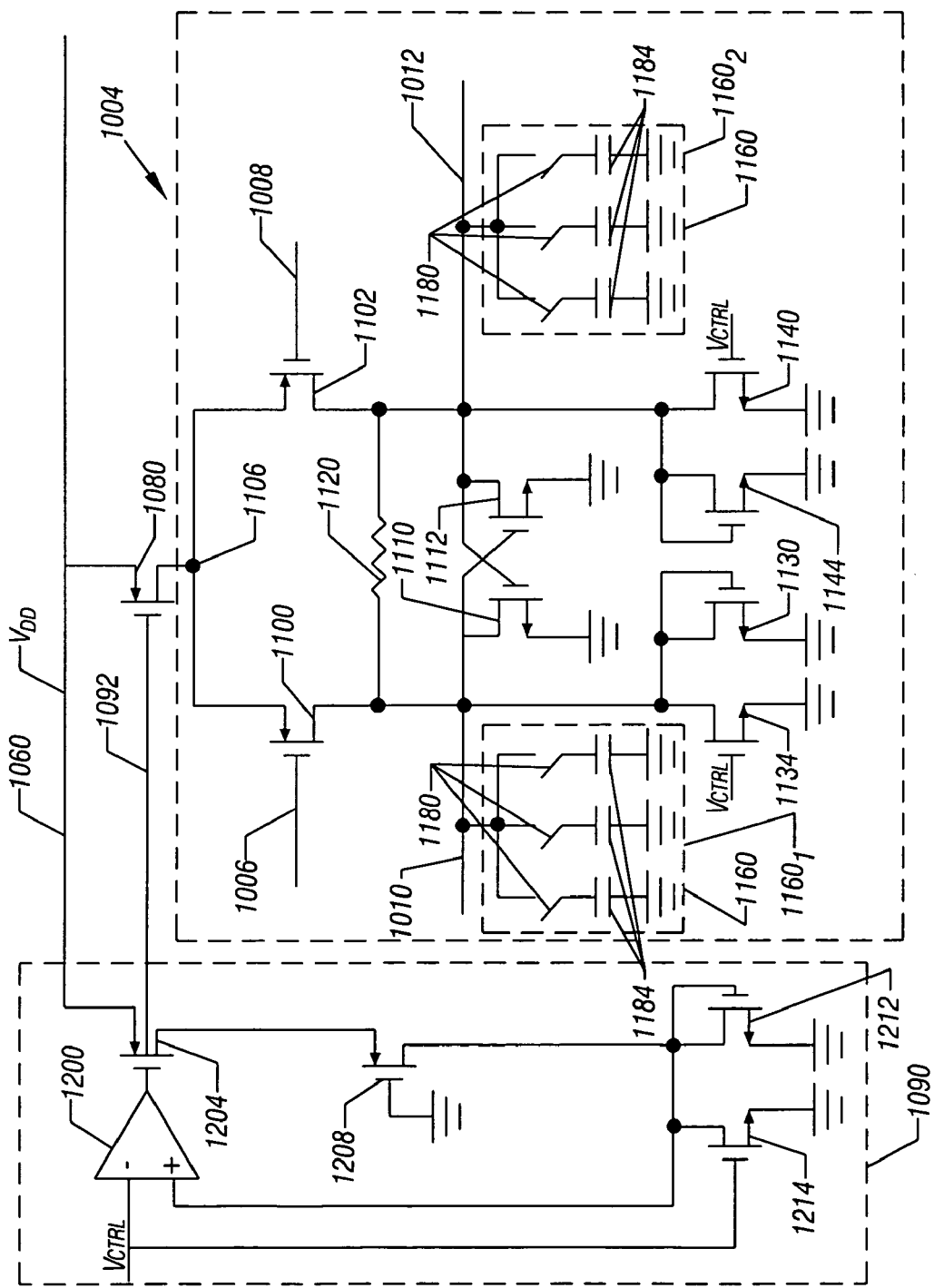
FIG. 12 is a schematic diagram of an inverter of the ring oscillator according to an embodiment of the invention.

Referring to FIG. 12, in accordance with some embodiments of the invention, a low $1/f^3$ phase noise is achieved by combining a PMOSFET differential pair (i.e., PMOSFETs 1100 and 1102) with a triode mode NMOSFET load. More specifically, in accordance with some embodiments of the invention, the PMOSFETs 1100 and 1102 have source terminals that are coupled together at a node 1106 that, in turn, is coupled to the drain terminal of the associated PMOSFET 1080. The drain terminal of the PMOSFET 1100 is coupled to the output terminal 1010, and the drain terminal of the PMOSFET 1102 is coupled to the output terminal 1012. The gate terminal of the PMOSFET 1100 is coupled to the input terminal 1006, and the gate terminal of the PMOSFET 1102 is coupled to the input terminal 1008.

The above-mentioned cross-coupled latch is formed from two NMOSFETs 1110 and 1112. More specifically, the gate terminal of the NMOSFET 1110 is coupled to the output terminal 1012, and the gate terminal of the NMOSFET 1112 is coupled to the output terminal 1010. The source terminals of the NMOSFETs 1110 and 1112 are coupled to ground; and the drain terminals of the NMOSFETs 1110 and 1112 are coupled to the output terminals 1010 and 1012, respectively.

The load for each transistor of the PMOSFET 1100, 1102 differential pair is provided by a MOSFET diode that is coupled in parallel with a MOSFET triode. More specifically, the drain terminal of the PMOSFET 1100 is coupled to the drain terminal of a NMOSFET 1134. The source terminal of the NMOSFET 1134 is coupled to ground, and the gate terminal of the NMOSFET 1134 receives the $V_{CTRL}$ control signal. Thus, the NMOSFET 1134 forms a triode load. The drain terminal of the NMOSFET 1134 is also coupled to the gate and drain terminals of an NMOSFET 1130. The source terminal of the NMOSFET 1130 is coupled to ground. Therefore, the NMOSFETs 1134 and 1130 form the diode and triode parallel load to the PMOSFET 1100.

The PMOSFET 1102 is coupled to a similar load. More specifically, the drain terminal of the PMOSFET 1102 is coupled to the drain terminal of an NMOSFET 1140. The gate terminal of the NMOSFET 1140 receives the $V_{CTRL}$ control signal, and the source terminal of the NMOSFET 1140 is coupled to ground. The drain terminal of the NMOSFET 1140 is also coupled to the gate and drain terminals of an NMOSFET 1144, and the source terminal of the NMOSFET 1144 is coupled to ground.

In accordance with some embodiments of the invention, the replica bias circuit 1090 includes a triode (formed from an NMOSFET 1214) and a diode (formed from an NMOSFET 1212) that are coupled together to duplicate the load of each side of the inverter 1004. The replica bias circuit 1090 regulates the current from each transistor 1080 based on the response of its diode and triode loads.

More specifically, in accordance with some embodiments of the invention, the replica bias circuit 1090 includes an amplifier 1200 that establishes a given bias voltage relationship between the drain terminals of the NMOSFETs 1212 and 1214 and the $V_{CTRL}$ control signal. The non-inverting input terminal of the amplifier 1200 is connected to the drain terminals of the NMOSFET 1212 and 1214, and the inverting input terminal of the amplifier 1200 is connected to the gate terminal of the triode load NMOSFET 1214. The output terminal of the amplifier 1200 is connected to the gate terminal of a PMOSFET 1204. The PMOSFET 1204, similar to each of the transistors 1080, has its source terminal coupled to the supply rail 1060, and the gate terminal of the PMOSFET 1204 is connected to the output terminal 1092 that is driven by the output terminal of the amplifier 1200. The drain terminal of the PMOSFET 1204 is coupled to the drain terminals of the PMOSFETs 1212 and 1214 via a cascode PMOSFET 1208. More specifically, the source terminal of the PMOSFET 1208 is coupled to the drain terminal of the PMOSFET 1204, the gate terminal of the PMOSFET 1208 is coupled to ground, and the drain terminal of the PMOSFET 1208 is coupled to the drain terminals of the PMOSFETs 1212 and 1214.

Among the other features of the inverter 1004, in accordance with some embodiments of the invention, a shunt resistor 1120 is coupled between the output terminals 1010 and 1012. The current that flows through the shunt resistor 1120 depends on the instantaneous amplitude of the differential output signal from the inverter 1004. The additional current that flows through the shunt resistor 1120 charges and discharges the capacitors that are coupled to the inverter 1004. Because this current does not come from the control node, the overall gain of the oscillator 1000 is significantly decreased. The decreased gain, in turn, helps spur and noise rejection, and the decreased gain also reduces the required bias current at maximum oscillating frequency, thereby saving power.

As also depicted in FIG. 12, in accordance with some embodiments of the invention, a capacitor bank 1160 (banks 1160₁ and 1160₂ being depicted in FIG. 12) is coupled to each output terminal 1010, 1012 for purposes of controlling the overall frequency gain of the ring oscillator 1000. More specifically, the oscillator gain ($K_{VCO}$) is changed through the use of the banks 1160 for purposes of keeping the $K_{VCO}$ gain proportional with the divider modulus (N) of the divider 156 (see FIG. 10). Thus, by controlling the gain of the capacitor banks 1160 appropriately, the $K_{VCO}$ oscillator gain is changed so that the $K_{VCO}/N$ term is constant to ensure a divider independent PLL damping factor and bandwidth.

As depicted in FIG. 12, in accordance with some embodiments of the invention, each capacitor bank 1160 may include, for example, capacitors 1184, with each capacitor 1184 being selectively coupled between the output terminal and ground via an associated switch 1180. Although FIG. 12 depicts three capacitors 1184 for each bank 1160, it is noted that other numbers of capacitors may be used, in other embodiments of the invention. Furthermore, in accordance with some embodiments of the invention, each capacitor 1184 may have the same capacitance; and in other embodiments of the invention, the capacitances of the capacitors 1184 may have different weights (may be binarily-weighted, for example). Thus, many variations are possible and are within the scope of the appended claims.

Figure 13:
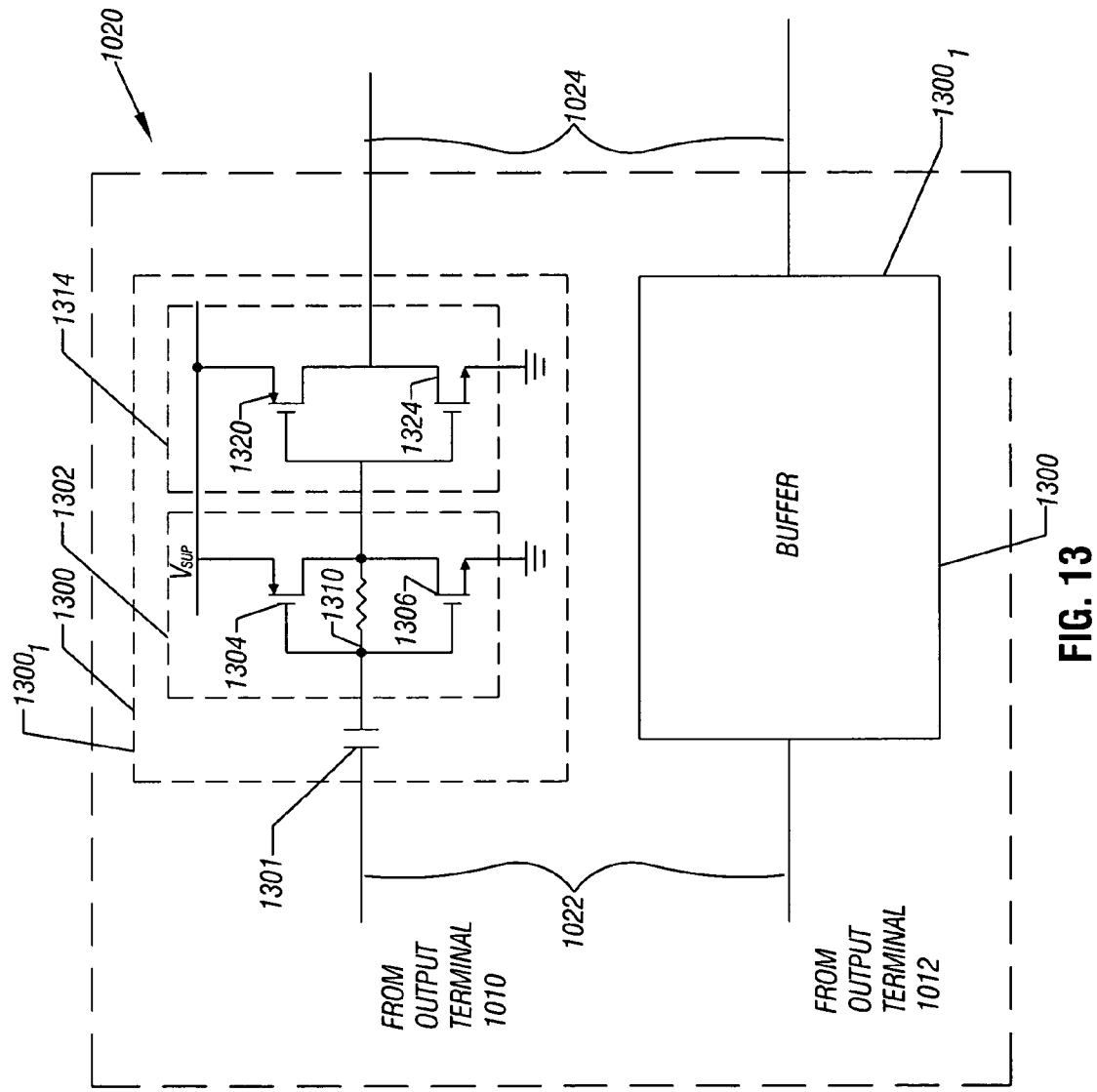
FIG. 13 is a schematic diagram of an output buffer of the ring oscillator according to an embodiment of the invention.

The output buffers 1020 of the ring oscillator 1000 may have a variety of different designs, depending on the particular embodiment of the invention. FIG. 13 depicts one such design. More particularly, in accordance with some embodiments of the invention, the buffer 1020 includes two output stages 1300₁ and 1300₂ that share a common design 1300.

The output stage 1300 includes a capacitor 1301 that is coupled to the output terminal 1010, 1012. The output signal from the capacitor 1301 is provided to a first complimentary metal oxide semiconductor (CMOS) inverter stage 1302. More specifically, the CMOS inverter stage 1302 may be formed, for example, from a PMOSFET 1304 and an NMOSFET 1306. As also shown in FIG. 13, a feedback resistor 1310 may be coupled between the input and output terminals of the CMOS inverter stage 1302. As also depicted in FIG. 13, in accordance with some embodiments of the invention, the output terminal of the CMOS inverter stage 1302 may be coupled to another CMOS inverter stage 1312, which is shown in FIG. 13 as being formed from a PMOSFET 1320 and an NMOSFET 1324. The output terminal of the CMOS inverter stage 1314, in turn, may provide the output signal for the output stage 1300. The other buffer stage 1300₁ may be formed in a similar manner.

Figure 14:
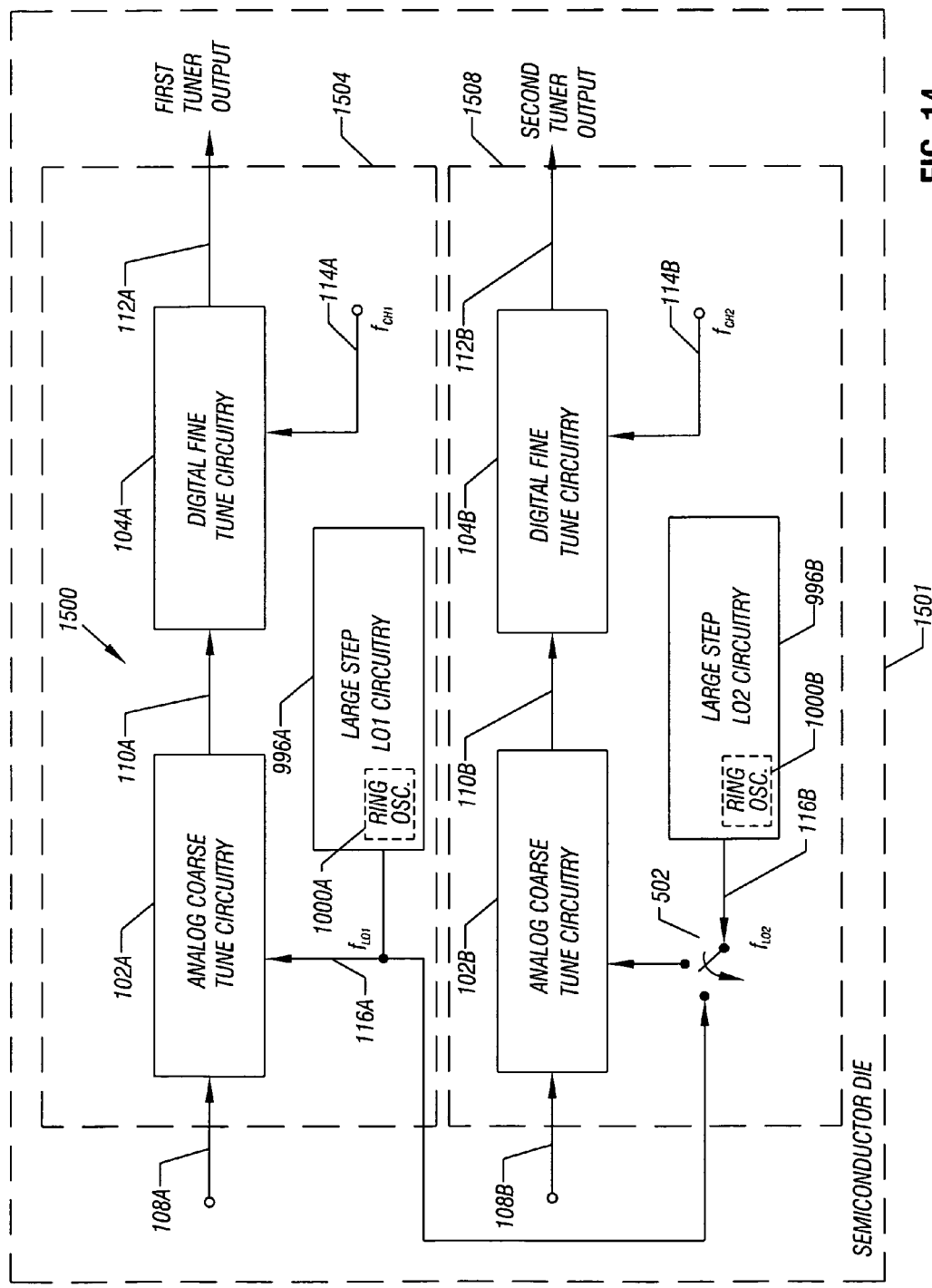
FIG. 14 is a schematic diagram of a dual tuner receiver that includes ring oscillators according to embodiment of the invention.

The ring oscillator 1000 may be used in a dual tuner architecture in accordance with some embodiments of the invention. For example, referring to FIG. 14, in accordance with some embodiments of the invention, ring oscillators 1000A and 1000B (each having a design 1000 shared in common) may be used in a dual tuner receiver 1500. The receiver 1500 is similar to the receiver depicted and described above in connection with FIG. 5A, with similar reference numerals being used to denote similar features. However, unlike the tuner depicted in FIG. 5A, the LO circuitry 106A and 106B is replaced by LO circuitry 996A and 996B, respectively. The LO circuitry 996A and 996B has a similar design to the LO circuitry 106A and 106B, except that the LO circuitry 996A and 996B includes ring oscillators 1000. Thus, the LO circuitry 996A includes a ring oscillator 1000A; and the LO circuitry 996B includes a ring oscillator 1000B. As a more specific example, the LO circuitry 996A and 996B may have a design similar to the one depicted in FIG. 10, in accordance with some embodiments of the invention.

Thus, due to the above-described arrangement, each tuner 1504 and 1508 uses a ring oscillator 1000A, 1000B for purposes of generating the local oscillator signals for the associated analog coarse tune circuitry 102A, 102B. The tuners 1504 and 1508 may be fabricated on the same semiconductor die 1501.

Due to the use of ring oscillators, magnetic, or inductive, coupling is minimized and electrical, or capacitive, coupling is also minimized, as compared to LC oscillators, for example. The relative small size of the ring oscillator, as compared to an LC oscillator, reduces the overall substrate area of the PLL to reduce the capacitive coupling between the tuners. The relatively small metal loops of the ring oscillator also creates relatively little magnetic coupling between the tuners as well.

Additionally, due to the relatively large frequency steps that may be used with the ring oscillator, the minimal distance between the tuning frequencies of the dual tuners may be significantly larger than the minimal distance between the tuning frequencies of conventional LC oscillator-based dual tuners. This avoids the potential problem of adjacent PLLs trying to pull each other toward their tuning frequencies, which creates phase noise.

It is noted that although in some embodiments of the invention, dual tuners may be fabricated on the semiconductor die, other variations are possible in other embodiments of the invention. For example, in other embodiments of the invention, the dual tuners may be fabricated on separate dies. Furthermore, in other embodiments of the invention, the dual tuners may be present in different semiconductor packages.

Therefore, many variations are possible and are within the scope of the appended claims.

Figure 15:
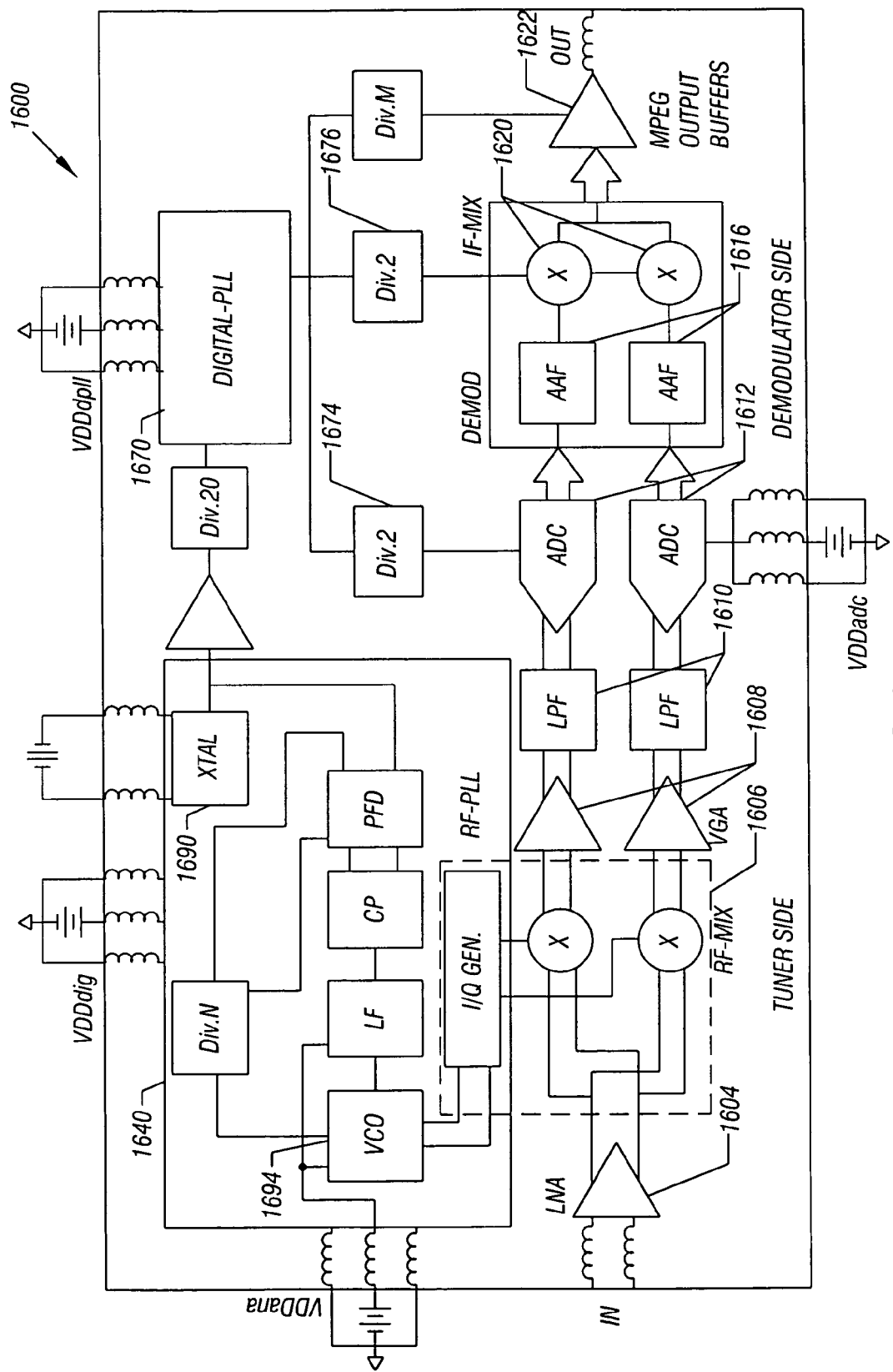
FIG. 15 is a schematic diagram of a receiver according to an embodiment of the invention.

FIG. 15 depicts an embodiment of a single chip DBS tuner-demodulator integrated circuit (hereafter called a "receiver 1600") in accordance with an embodiment of the invention. The receiver 16 includes a front-end low noise amplifier (LNA) controlled by an automatic gain control (AGC) loop; an I'Q complex mixer 1606 followed by variable gain amplifiers 1608 and low-pass filters 1610; two analog-to-digital converters (ADCs) 1612 that drive the digital core having a digital anti-aliasing filter 1616; a second complex digital mixer 1620; the demodulator and an output MPEG transport stream buffers 1622.

The receiver 1600 has two frequency synthesizers: an RF PLL 1640 (0.9-2.2 GHz) located on the analog side that generates the I/Q quadrature LO for the RF complex mixer 1606; and a digital-PLL 1670 (400 MHz) that generates the clocks for the ADCs 1612, the digital core and the output buffers 1622. The RF PLL 1640 includes a ring oscillator 1694, in some embodiments of the invention. The PLLs 1640 and 1670 are operating from the same crystal oscillator 1690, but they have different reference frequencies (20 MHz for the RF-PLL 1606 and 1 MHz for the digital-PLL 1670). The ADC 1612 and the digital-core use divide by two circuits 1674 and 1676, respectively, to generate a precise 50% duty cycle clock, while the frequency of the output is set by the MPEG decoder IC requirement. This makes the RF and digital clocks not to be always harmonically related and therefore can generate parasitic mixing spurs on the RF clock which give undesired reciprocal mixing.

In a mixed-signal IC the largest spurs usually appear due to magnetic coupling between bondwires, and to a lesser extend between metal interconnect lines or between metal lines and bondwires. In single-chip DBS receivers high frequency impulsive currents are generated by the ADCs and the MPEG transport stream buffers, and also by the digital PLL and the digital core. The corresponding supply bondwires are carefully placed allowing a wide physical separation and a 90° orientation. Magnetically differential supply lines were used to reduce parasitic coupling.

Magnetically differential interconnections were also used to minimize the coupling between metal lines, while the blocks that generate large impulsive currents were placed inside metal cages using the top layer metal for minimum added parasitic capacitances to the critical signal lines.

The substrate noise was reduced by placing the analog and digital circuits in separate local substrates isolated from the global substrate by deep N-well layers available in modem CMOS processes. A moat separates the analog tuner from the digital demodulator, providing an additional 20 dB of attenuation to the high frequency substrate noise The on-chip supply bypass capacitors together with the supply bondwires and the off-chip filtering capacitors constitute a parasitic LC circuit. A poor damping results in a significant boosting of the impulsive current going through the bondwire (at tank's resonance frequency) in comparison to the supply current of the on-chip circuit, leading to a stronger parasitic coupling. To minimize this effect series resistance can be added to improve the damping (usually implemented by the MOS cap series gate resistance) and larger on-chip bypass capacitances can be used to move the resonant frequency lower than the excitation frequency spectrum.

One of the major couplings is from the supply bondwires of the digital side blocks and the bondwire connecting the off-chip crystal to the crystal oscillator. These high frequency coupled tones appear directly at the input of the reference path squaring buffer. The high frequency tones that are not harmonically related with the 20 MHz reference frequency of the RF synthesizer are down-converted into a ±10 MHz range around the reference clock by the nonlinear edge squaring action. If the down-converted spurs are falling inside the PLL bandwidth (1 MHz), they are gained-up with no attenuation by the feedback divider modulus (N) when reflected to the PLL output. To achieve output spur levels lower than −50 dBc an RC filter was placed in front of the reference clock squaring-buffer in order to attenuate the high frequency tones before they go through the non-linear operation. The high frequency tones from the digital side also couple to the digital supply bondwire of the RF PLL 1640 where the reference clock buffer and the charge-pump are connected.

Advantages of the receiver 1600 may include one or more of the following. A reduced die area due to the small area ring oscillator 1694 that covers the entire satellite TV spectrum. Avoiding the large area on-chip inductors has also minimized the sensitivity to parasitic coupling from the noisy digital circuits, allowing the single-chip integration of the DBS tuner and demodulator.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   receiving a signal spectrum including a plurality of channels within a first frequency range;
   receiving a selection signal identifying at least one desired channel be tuned;
   providing an oscillator having a second frequency range substantially the same as the first frequency range;
   controlling the oscillator to generate one of a plurality of coarse-tune analog mixing signals, the signals substantially spanning across the second frequency range and each depending upon the location of the desired channel within the signal spectrum;
   mixing the signal spectrum with the selected coarse-tune analog mixing signal to generate a coarsely tuned signal spectrum; and
   digitally processing the coarsely tuned signal spectrum to fine tune the desired channel and to produce digital baseband signals for the desired channel.

2. The method of claim 1, wherein the oscillator comprises a ring oscillator.

3. The method of claim 1, wherein second frequency range comprises range of a satellite broadcast spectrum.

4. The method of claim 1, wherein second frequency range comprises one to five megahertz.

5. The method of claim 1, wherein the signal spectrum comprises a channel signal spectrum from satellite communications, the satellite channel signal spectrum comprising a plurality of transponder channels with each transponder channel including a plurality of program channels.

6. The method of claim 1, further comprising separating the frequency range of the signal spectrum into a plurality of frequency bins and associating at least one coarse-tune analog mixing signal with each frequency bin.

7. The method of claim 1, wherein the digital processing step comprises using a wide-band analog-to-digital converter to convert the coarsely tuned signal spectrum to digital signals and using a tunable digital filter to tune the desired channel.

8. A receiver comprising:
an oscillator adapted to provide a coarse-tune analog mixing signal in response to a channel selection signal that indicates a designed channel to be tuned from a signal spectrum of an input signal, the oscillator having a frequency range substantially the same as a frequency range of the signal spectrum such that the oscillator is adapted to establish a frequency of the coarse-tune analog mixing signal anywhere within the frequency range of the signal spectrum based on the channel selection signal; and
analog coarse tune circuitry to generate a coarsely-tuned signal spectrum in response to the coarse-tune analog mixing signal; and
digital fine tune circuitry to provide at least one digital baseband signal in response to the coarsely tuned signal spectrum.

9. The receiver of claim 8, wherein the oscillator comprises a ring oscillator.

10. The receiver of claim 8, wherein the frequency range of the oscillator comprises range of a satellite broadcast spectrum.

11. The receiver of claim 8, wherein the frequency range of the oscillator comprises one to five megahertz.

12. The receiver of claim 8, wherein the signal spectrum comprises a channel signal spectrum from satellite communications, the satellite channel signal spectrum comprising a plurality of transponder channels with each transponder channel including a plurality of program channels.

13. The receiver of claim 8, further comprising separating the frequency range of the signal spectrum into a plurality of frequency bins and associating at least one coarse- tune analog mixing signal with each frequency bin.

14. The receiver of claim 8, wherein the digital processing step comprises using a wide-band analog-to-digital converter to convert the coarsely tuned signal spectrum to digital signals and using a tunable digital filter to tune the desired channel.

15. The receiver of claim 8, wherein the oscillator is part of a phase locked loop.

16. A semiconductor package comprising:
a monolithic semiconductor die;
a first tuner fabricated in the die to receive an input signal having a signal spectrum, the first tuner comprising:
a first ring oscillator to provide a first coarse-tune analog mixing signal in response to a channel selection signal that indicates a desired channel to be tuned from the signal spectrum;
first analog coarse tune circuitry to generate a first coarsely-tuned signal spectrum in response to the second coarse-tune analog mixing signal; and
digital fine tune circuitry to provide at least one digital baseband signal in response to the first coarsely tuned signal spectrum ; and
a second tuner fabricated in the die to receive the input signal, the second tuner comprises a ring oscillator to provide a mixing signal for the second tuner.

17. The semiconductor package of claim 16, wherein the second ring oscillator provides a second coarse-tune analog mixing signal in response to a channel selection signal that indicates a desired channel to be tuned from the signal spectrum, the second tuner further comprising:
second analog coarse tune circuitry to generate a second coarsely-tuned signal spectrum in response to the second coarse-tune analog mixing signal; and
second digital fine tune circuitry to provide at least one digital baseband signal in response to the second coarsely tuned signal spectrum.

18. The semiconductor package of claim 16, wherein the first oscillator is part of a phase locked loop.

19. The semiconductor package of claim 16, frequency range of the first oscillator comprises range of a satellite broadcast spectrum.

20. The semiconductor package of claim 16, wherein the frequency range of the oscillator comprises one to five megahertz.

21. A method comprising:
providing a monolithic semiconductor die containing a first tuner and a second tuner, the first tuner to receive an input signal having a signal spectrum;
controlling a first ring oscillator of the first tuner to provide a first coarse-tune analog mixing signal in response to a channel selection signal that indicates a desired channel to be tuned from the signal spectrum;
generating a first coarsely-tuned signal spectrum in response to the second coarse-tune analog mixing signal;
digitally fine tuning to provide at least one digital baseband signal in response to the first coarsely tuned signal spectrum ; and
controlling a second ring oscillator in the second tuner provide a mixing signal for the second tuner in response to the input signal.

22. The method of claim 21, wherein the act of controlling the second ring oscillator generates a second coarse-tune analog mixing signal in response to a channel selection signal that indicates a desired channel to be tuned from the signal spectrum.

23. The method of claim 22, further comprising:
generating a second coarsely-tuned signal spectrum in response to the second coarse-tune analog mixing signal; and
digitally fine tuning to provide at least one digital baseband signal in response to the second coarsely tuned signal spectrum.

24. The method of claim 21, further comprising:
controlling the first ring oscillator as part of a phase locked loop.

25. The method of claim 21, wherein the frequency range of the first oscillator comprises range of a satellite broadcast spectrum.

* * * * *